(12) United States Patent
Morita

(10) Patent No.: US 7,138,581 B2
(45) Date of Patent: Nov. 21, 2006

(54) LOW RESISTANCE CONDUCTOR, PROCESSES OF PRODUCTION THEREOF, AND ELECTRICAL MEMBERS USING SAME

(75) Inventor: Mitsuru Morita, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 10/239,094

(22) PCT Filed: Jan. 16, 2002

(86) PCT No.: PCT/JP02/00254

§ 371 (c)(1),
(2), (4) Date: Sep. 16, 2002

(87) PCT Pub. No.: WO02/056318

PCT Pub. Date: Jul. 18, 2002

(65) Prior Publication Data

US 2003/0132023 A1   Jul. 17, 2003

(30) Foreign Application Priority Data

Jan. 16, 2001 (JP) .............................. 2001-007372
Sep. 12, 2001 (JP) .............................. 2001-277050
Sep. 26, 2001 (JP) .............................. 2001-293044
Sep. 26, 2001 (JP) .............................. 2001-293045

(51) Int. Cl.
*H01B 12/00* (2006.01)

(52) U.S. Cl. ................ 174/125.1; 174/126.2; 174/126.4; 174/113 R; 174/114 R; 174/25 R

(58) Field of Classification Search ............. 174/126.2, 174/126.4, 125.1, 113 R, 114 R, 25 R; 428/558, 428/554, 546

See application file for complete search history.

(56) References Cited

U.S. PATENT DOCUMENTS

| 5,298,679 A | * | 3/1994 | Wu et al. ................ 174/15.4 |
| 5,346,883 A | * | 9/1994 | Shiga et al. .............. 505/100 |
| 5,581,135 A | * | 12/1996 | Ito et al. .................. 310/52 |
| 6,069,369 A | * | 5/2000 | Nishino et al. ............ 257/34 |

FOREIGN PATENT DOCUMENTS

| JP | 02192104 A | * | 7/1990 |
| JP | 5-279028 | | 10/1993 |
| JP | 6-40775 | | 2/1994 |
| JP | 7-17774 | | 1/1995 |
| JP | 7-192837 | | 7/1995 |
| JP | 10-136563 | * | 5/1998 |
| JP | 10275641 | | 10/1998 |
| JP | 11-16618 | | 1/1999 |
| JP | 11-191511 | | 7/1999 |
| JP | 2000-133067 | | 5/2000 |
| JP | 2000302595 A | * | 10/2000 |

OTHER PUBLICATIONS

Abstract of JP 2000-302595A Fujimoto et al.*
English abstract for cited Japanses patent document JP 02192104A, Jul. 1990, Nippon Steel Corp.*
Abstract and partial translation of JP 10-136563, Mitsuru May 1998.*

* cited by examiner

*Primary Examiner*—Jinhee Lee
(74) *Attorney, Agent, or Firm*—Kenyon & Kenyon LLP

(57) ABSTRACT

A conductor obtained by connecting a plurality of superconductors by normal conductivity or a conductor including superconductors and normal conductors, said low resistance conductor using superconductors characterized in that an apparent specific resistance of said conductor at below a superconducting transition temperature of said superconductors is lower than the specific resistance of copper at that superconducting transition temperature.

19 Claims, 20 Drawing Sheets

Fig. 4
(a) 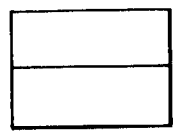
(b) 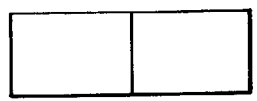
(c) 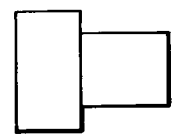
(d) 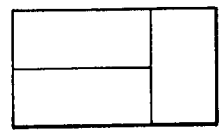
(e) 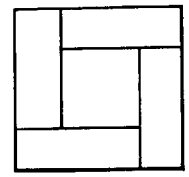

Fig.7
(a)
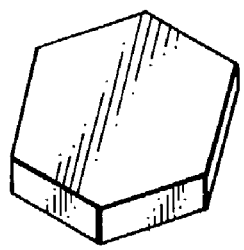
(b)
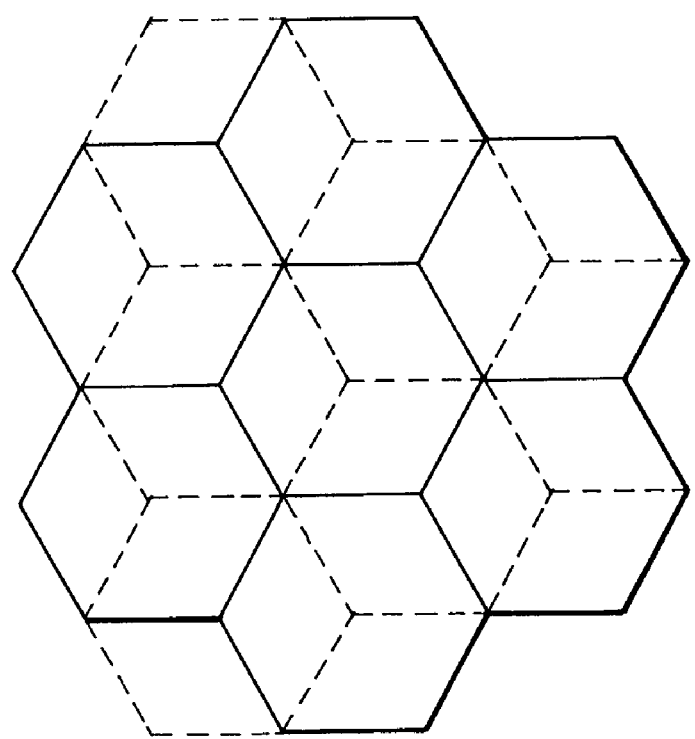

Fig.8
(a)
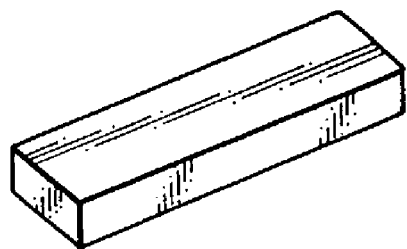
(b)
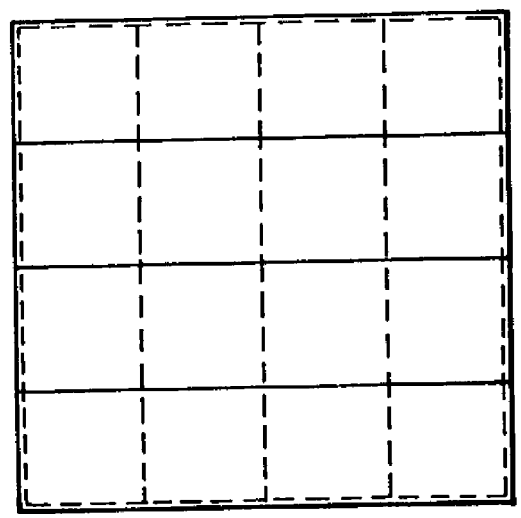

Fig.9
(a) 
(b) 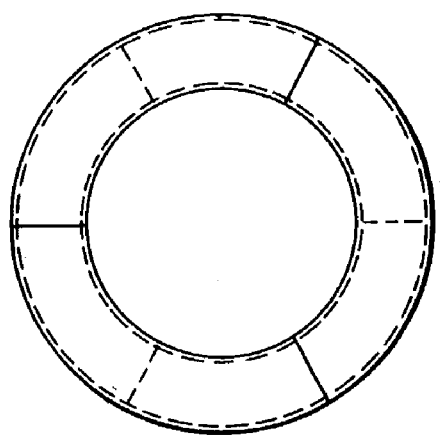
(c) 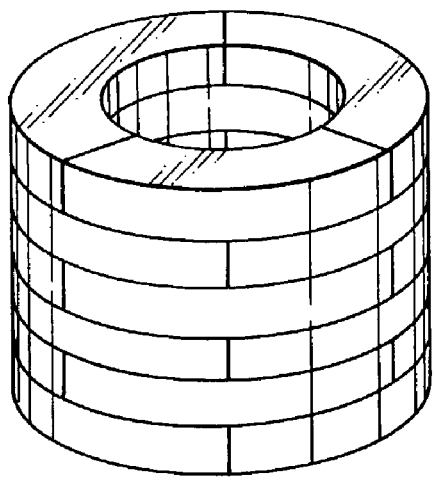

Fig.10
(a)
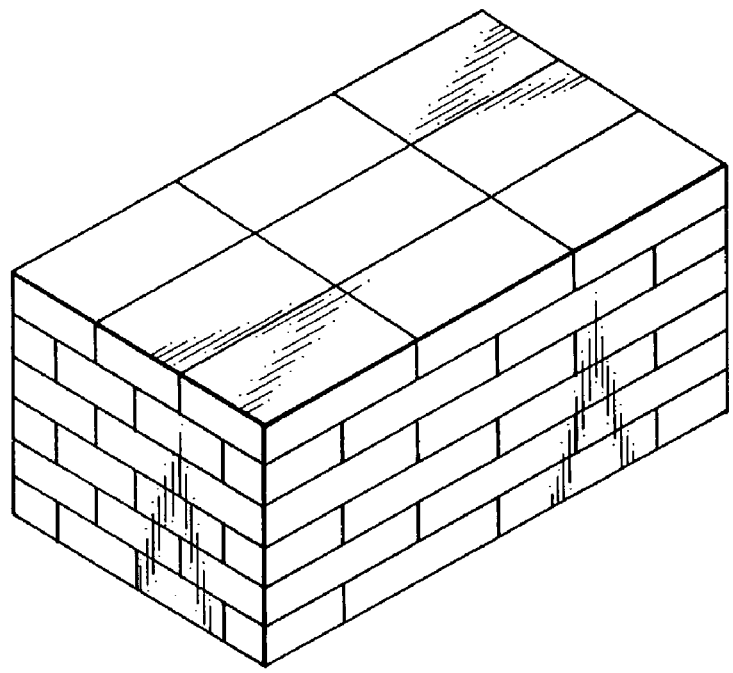
(b)
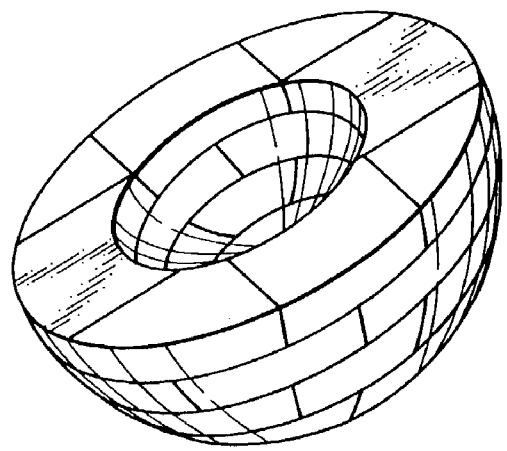

Fig.11
(a) 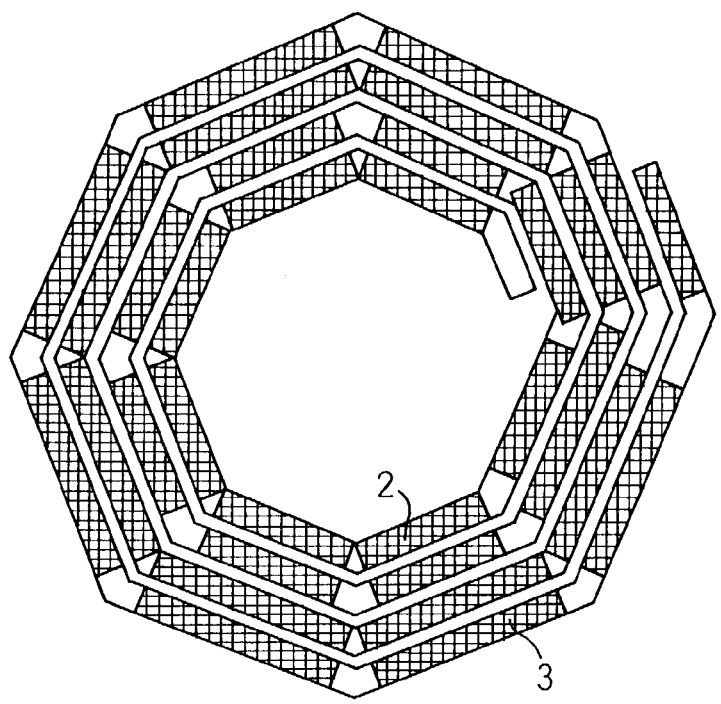
(b) 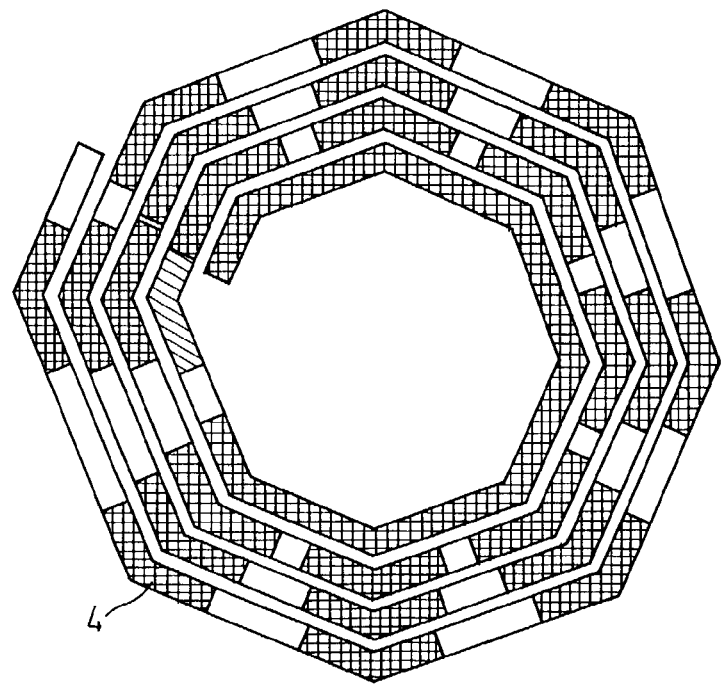

Fig. 12
(a)
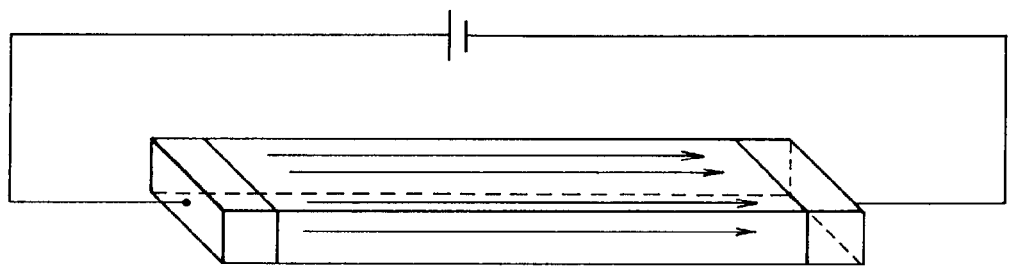
(b)
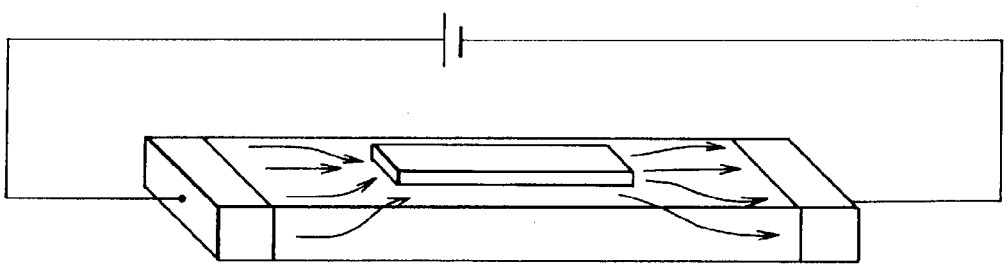

Fig.13
(a)
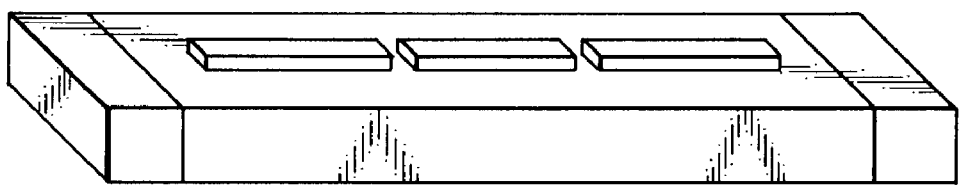
(b)
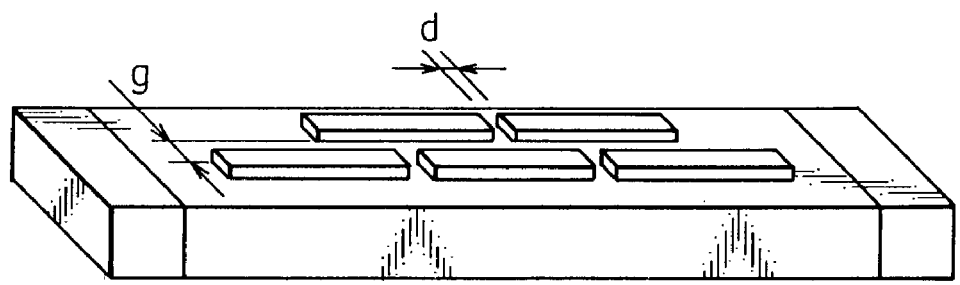

Fig.14
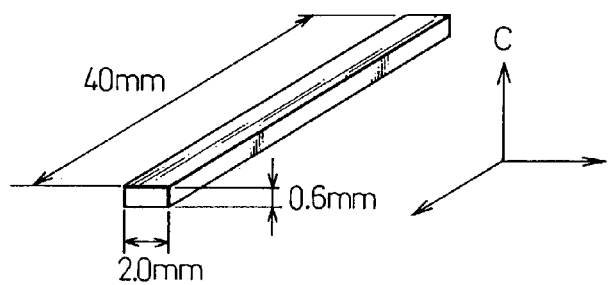
Fig.15
(a) 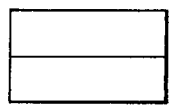   (b) 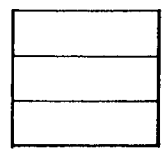   (c) 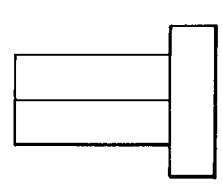

Fig.16
(a)
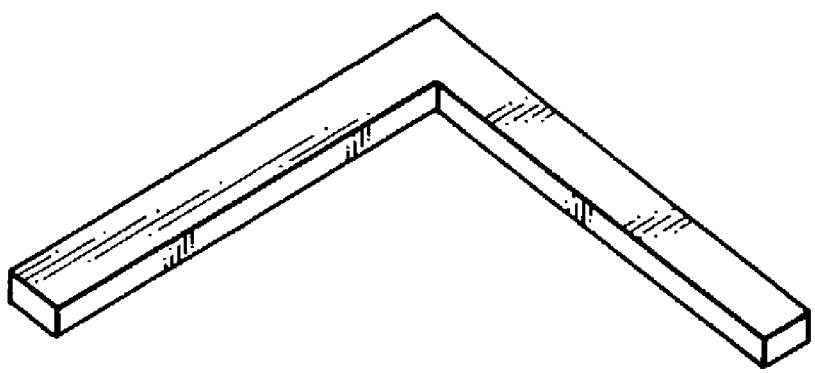
(b)
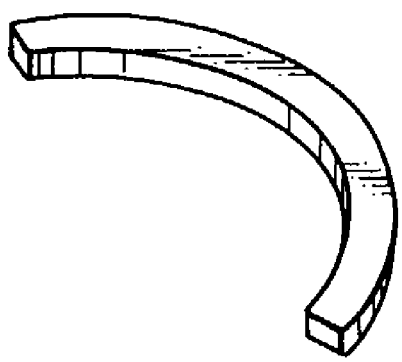

Fig.17
(a)
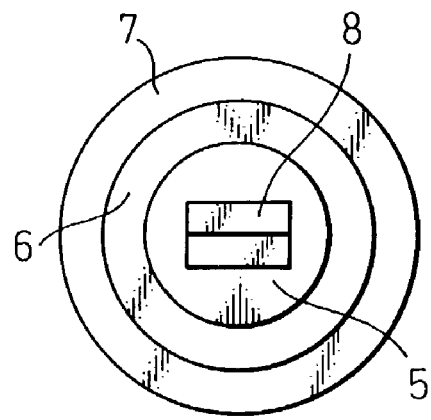
(b)
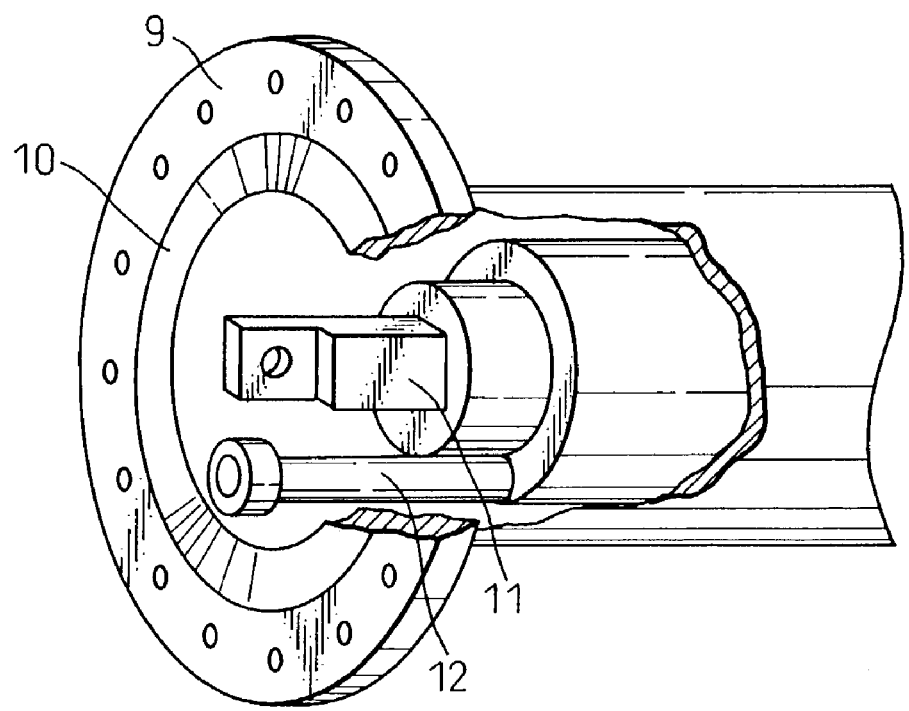

Fig.21
(a)
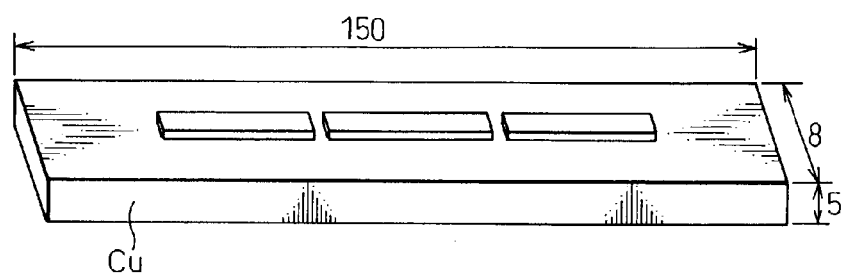
(b)
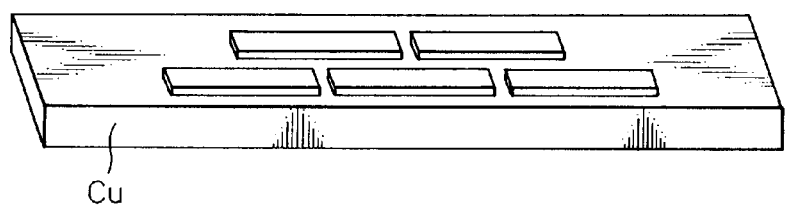
(c)
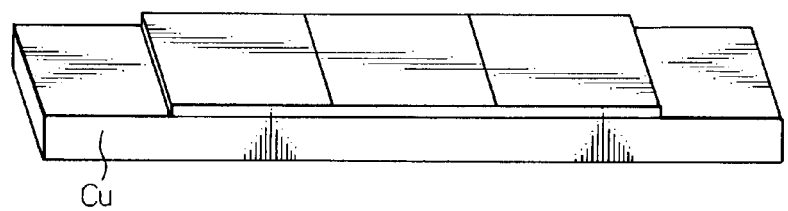

LOW RESISTANCE CONDUCTOR, PROCESSES OF PRODUCTION THEREOF, AND ELECTRICAL MEMBERS USING SAME

TECHNICAL FIELD

The present invention relates to a substantially low resistance electrical conductor, a process of production thereof, and apparatuses using the same.

BACKGROUND ART

As a conductor for carrying electricity, copper is being used the most at the present time. This is due to the facts that the specific resistance at room temperature is about the same degree as with silver and lowest compared with other substances and that it is relatively inexpensive. As the method for reducing the specific resistance of a conductor, there is the method of cooling the conductor. In the case of copper, if cooled to the temperature of liquid nitrogen (77K), the specific resistance becomes about one-seventh or about $2.5 \times 10^{-9}$ $\Omega$m.

A superconducting wire has to be cooled to under the superconducting transition temperature, but the electrical resistance is substantially zero making it an ideal conductor. A metal-based superconducting wire is highly perfected as a wire and is being used in MRI systems etc. as magnets, but has not spread widely in use due to the need for cooling to a cryogenic temperature.

On the other hand, oxide-based superconducting materials becoming superconductive at the liquid nitrogen temperature include Bi-based and Y-based materials. Bi-based materials are mainly being developed as tape wires with silver sheaths, while Y-based materials are being developed as tape wires comprised of metal tapes formed on their surfaces with buffer layers and formed on those with superconductive thin films.

These wires are increasingly promising since when high properties are obtained, they can be cooled by easy-to-handle liquid nitrogen. Further, the development and spread of electrical apparatuses using these wires can be expected. Further, as plate-shaped superconductors, NbTi and Cu multilayer plates are being developed and are being used for magnetic shields and other applications.

As oxide superconducting bulk materials having sufficient critical current densities at the liquid nitrogen temperature, materials comprised of monocrystalline $REBa_2Cu_3O_{7-x}$ (where RE is a rare earth element including Y) in which $RE_2BaCuO_5$ is finely dispersed is known. Since such materials are monocrystalline, there are technical limits in the production of large-sized materials. At the present time, only ones of a diameter of around 100 mm are known. Larger materials than this have not been obtained.

Bi-based wires, however, do not give a sufficient critical current density at 77K and in particular suffer from the problems that there is remarkable deterioration of properties in a magnetic field, that they are expensive since silver is used as a sheath material, etc. Y-based wires suffer from problems in the film forming speed in a vacuum, uniformity of properties, etc. and are still in development.

DISCLOSURE OF INVENTION

If it were possible to produce an easy-to-handle conductor with a sufficiently low specific resistance and inexpensive price, then it would not necessarily have to be a superconducting wire with zero electrical resistance. Therefore, the present invention has as its object the provision of a conductor with a sufficiently small specific resistance. Further, it has as its object the provision of an easy-to-handle electrical apparatus with little power loss using such a conductor.

Technology for connecting a plurality of bulk superconductors by superconductivity has been disclosed in Japanese Unexamined Patent Publication (Kokai) No. 5-279028, Japanese Unexamined Patent Publication (Kokai) No. 6-40775, and Japanese Unexamined Patent Publication (Kokai) No. 7-17774, but the present invention provides a conductor relatively simply connected through a normal conductor conductor having a finite electrical resistance and a process for production of the same and an electrical apparatus using such a conductor.

As one example, in mainly Y-based oxide superconducting bulk materials, a high critical current density has already been obtained at 77K. It was discovered that by electrically connecting superconductors as represented by such materials and a normal conductor, a substantially low resistance conductor and an electrical apparatus using the same can be obtained.

The present invention was made based on this discovery and has as its gist the following:

(1) A low resistance conductor using superconductors comprised of a plurality of superconductors connected by normal conductivity, said conductor characterized in that an apparent specific resistance of said conductor below a superconducting transition temperature of said superconductors is lower than a specific resistance of copper at said superconducting transition temperature.

(2) A low resistance conductor using superconductors as set forth in (1), wherein said conductor is a wire-shaped and/or bar-shaped conductor comprised of a plurality of superconductors connected by normal conductivity two-dimensionally.

(3) A low resistance conductor using superconductors as set forth in (1), wherein said conductor is a plate-shaped and/or block-shaped conductor comprised of a plurality of superconductors connected by normal conductivity three-dimensionally.

(4) A low resistance conductor using superconductors comprised of a plurality of superconductors connected by normal conductivity, said conductor characterized in that an apparent specific resistance of said conductor at 77K is lower than a specific resistance of copper at 77K.

(5) A low resistance conductor using superconductors as set forth in (4), wherein said conductor is a wire-shaped and/or bar-shaped conductor comprised of a plurality of superconductors connected by normal conductivity two-dimensionally.

(6) A low resistance conductor using superconductors as set forth in (4), wherein said conductor is a plate-shaped and/or block-shaped conductor comprised of a plurality of superconductors connected by normal conductivity three-dimensionally.

(7) A low resistance conductor using superconductors as set forth in any one of (1) to (6), wherein part or all of said plurality of superconductors are bulk superconductors.

(8) A low resistance conductor using superconductors as set forth in (7), wherein part or all of said plurality of bulk superconductors have bar or plate shapes.

(9) A low resistance conductor using superconductors as set forth in (7) or (8), wherein part or all of said plurality of bulk superconductors have curved and/or bent bar or plate shapes.

(10) A low resistance conductor using superconductors as set forth in any one of (7) to (9), wherein part or all of said bulk superconductors are $REBa_2Cu_3O_{7-x}$ based superconductors (where, RE is one type or a combination of types of rare earth elements including Y).

(11) A low resistance conductor using superconductors as set forth in (10), wherein a longitudinal direction of said bulk superconductor is a direction perpendicular to a c-axis in the crystal orientation of said superconductor.

(12) low resistance conductor using superconductors as set forth in any one of (1) to (6), wherein part or all of the normal conductivity connections of said plurality of superconductors are joints between faces substantially perpendicular and/or faces substantially parallel to a longitudinal direction of adjoining superconductors.

(13) A low resistance conductor using superconductors as set forth in (12), wherein a plurality of layers of superconductors are arranged so as to cover normal conductivity connections of said superconductors in the longitudinal direction.

(14) A low resistance conductor using superconductors as set forth in (12) or (13), wherein part or all of said normal conductivity connections are joints between adjoining superconductors through a metal.

(15) A low resistance conductor using superconductors as set forth in (14), wherein said metal is one or more of copper, a copper alloy, silver, a silver alloy, gold, a gold alloy, aluminum, and an aluminum alloy.

(16) A low resistance conductor using superconductors as set forth in (14) or (15), wherein a thickness of said metal is not more than 100 μm.

(17) A low resistance conductor using superconductors as set forth in any one of (1) to (16), wherein part or all of a longitudinal direction of said superconductors is a current carrying direction.

(18) A low resistance conductor using superconductors as set forth in any one of (1) to (17), wherein a distance between said superconductors is not more than 10 mm.

(19) A process of production of a low resistance conductor characterized by arranging a plurality of superconductors through normal conductors and connecting them while applying pressure if necessary.

(20) A process of production of a low resistance conductor using superconductors as set forth in (19) further comprising connecting said superconductors using solder.

(21) A process of production of a low resistance conductor characterized by arranging a plurality of superconductors through normal conductors, applying pressure if necessary, then heat treating them in a reduced pressure atmosphere or a vacuum.

(22) A process of production of a low resistance conductor using superconductors as set forth in (19) or (21), further comprising connecting said superconductors using a paste or foil of copper, a copper alloy, silver, a silver alloy, gold, a gold alloy, aluminum, or an aluminum alloy and suitably thereafter heat treating them same.

(23) A process of production of a low resistance conductor using superconductors as set forth in any one of (19) to (22), further comprising forming on the surface of said superconductors a coating of one or more of copper, a copper alloy, silver, a silver alloy, gold, a gold alloy, aluminum, and an aluminum alloy.

(24) A current carrying member or current lead characterized by arranging at least at part of the same a low resistance conductor using superconductors as set forth in any one of (1) to (18).

(25) A current carrying member or current lead as set forth in (24), wherein the two ends of said low resistance conductor are connected to electrodes comprised of copper, aluminum, gold, silver, or an alloy of the same.

(26) A power feed cable characterized by arranging at least at part of the same a current carrying member or current lead as set forth in (24) or (25).

(27) A power feed cable characterized by arranging a current carrying member or current lead as set forth in (24) or (25) in the middle of a space in a double pipe or higher multiwall pipe, providing a space through which a coolant can flow around the same, and providing a heat insulating layer at its outer circumference.

(28) A power feed cable as set forth in (26), electrically connecting electrodes connected to said current carrying member or current lead and covering said connecting electrode portions by a vacuum heat insulating layer.

(29) A coil characterized by being formed by winding a low resistance conductor using superconductors as set forth in one of (1) to (18).

(30) A coil as set forth in (29), wherein a sectional area of a face of said wound low resistance conductor perpendicular to a current carrying direction is larger at the inner circumference than the outer circumference.

(31) A coil as set forth in (29), wherein the superconductors of said wound low resistance conductor are a combination of superconductors having different rare earth compositions.

(32) A coil as set forth in any one of (29) to (31), wherein gaps in said wound low temperature conductor are used as coolant channels.

(33) A coil as set forth in any one of (29) to (32), wherein said wound low resistance conductor is reinforced by a resin and/or fiber-reinforced plastic.

(34) A magnetic field generating apparatus characterized by using a coil as set forth in any one of (29) to (33).

(35) A transformer characterized by using a coil as set forth in any one of (29) to (33) at least at a secondary side.

(36) An AC power source characterized by using a coil as set forth in any one of (29) to (33) at least at a secondary side.

(37) A low resistance composite conductor using superconductors obtained by connecting at least one superconductor to part or all of a surface of a normal conductivity conductor, characterized in that an apparent specific resistance of said composite conductor below a superconducting transition temperature of said superconductor is lower than a specific resistance of copper at that superconducting transition temperature.

(38) A low resistance composite conductor using superconductors obtained by connecting at least one superconductor to part or all of a surface of a normal conductivity conductor, characterized in that an apparent specific resistance of said composite conductor at 77K is lower than a specific resistance of copper at 77K.

(39) A low resistance composite conductor using superconductors as set forth in (37) or (38), wherein said normal conductivity conductor is a metal.

(40) A low resistance composite conductor using superconductors as set forth in (39), wherein said metal is one or more types of copper, a copper alloy, aluminum, an aluminum alloy, silver, a silver alloy, gold, or a gold alloy.

(41) A low resistance composite conductor using superconductors as set forth in (37) or (38), wherein part or all of said superconductors are bulk superconductors.

(42) A low resistance composite conductor using superconductors as set forth in (41), wherein part or all of said bulk superconductors are $REBa_2Cu_3O_{7-x}$ based superconductors (where, RE is one type or a combination of types of rare earth elements including Y).

(43) A low resistance composite conductor using superconductors as set forth in (42), wherein a longitudinal direction of part or all of said bulk superconductor is a direction perpendicular to a c-axis in a crystal orientation of said superconductors.

(44) A low resistance composite conductor using superconductors as set forth in any one of (37) to (43), wherein at least one of said normal conductivity conductor or superconductor has a bar shape or plate shape.

(45) A low resistance composite conductor using superconductors as set forth in (37) or (38), wherein part or all of said connections are normal conductivity connections.

(46) A low resistance composite conductor using superconductors as set forth in (45), wherein part or all of at least one of said superconductor or said normal conductivity conductor has a plane and said superconductor and said normal conductivity conductor are connected by normal conductivity in said plane.

(47) A low resistance composite conductor using superconductors as set forth in (45) or (46), wherein part or all of said normal conductivity connections use the same or different normal conductor as said normal conductivity conductor.

(48) A low resistance composite conductor using superconductors as set forth in any one of (45) to (47), wherein part or all of said normal conductivity connections are through a metal.

(49) A low resistance composite conductor using superconductors as set forth in (48), wherein said metal is one or more of copper, a copper alloy, aluminum, an aluminum alloy, silver, a silver alloy, gold, and a gold alloy.

(50) A low resistance composite conductor using superconductors as set forth in any one of (45) to (49), wherein a thickness of said connections is not more than 100 µm.

(51) A low resistance composite conductor using superconductors as set forth in any one of (37) to (50), wherein part or all of a longitudinal direction of said superconductors is a current carrying direction.

(52) A process of production of a low resistance composite conductor characterized by arranging at part or all of the surface of a normal conductivity conductor a superconductor through a normal conductor and connecting them while applying pressure if necessary.

(53) A process of production of a low resistance composite conductor as set forth in (52) wherein said normal conductor is solder.

(54) A process of production of a low resistance composite conductor characterized by arranging at part or all of the surface of a normal conductivity conductor a superconductor through a normal conductor, applying pressure if necessary, then heat treating them in a reduced pressure atmosphere or a vacuum.

(55) A process of production of a low resistance composite conductor as set forth in (52) or (54), wherein said normal conductivity conductor is a paste or foil of copper, a copper alloy, aluminum, an aluminum alloy, silver, a silver alloy, gold, or a gold alloy.

(56) A process of production of a low resistance composite conductor as set forth in any one of (52) to (55), further comprising forming on the surface of said superconductor a coating of one or more of copper, a copper alloy, aluminum, an aluminum alloy, silver, a silver alloy, gold, or a gold alloy.

(57) A current carrying member or current lead characterized by arranging at least at part of the same a low resistance composite conductor as set forth in any one of (37) to (50).

(58) A superconductor transformer or magnetic field generating apparatus characterized by having a current carrying member or current lead as set forth in (57).

BRIEF DESCRIPTION OF THE DRAWINGS

FIG. 4 gives views schematically showing cross-sections of low resistance conductors obtained by connecting pluralities of superconductors.

FIG. 7 gives views of an example of a plate-shaped superconductor and a plate-shaped low resistance conductor obtained by connecting the same. (a) shows an example of a hexagonal plate-shaped superconductor. (b) shows an example of a plate-shaped low resistance conductor obtained by alternately connecting hexagonal plate-shaped superconductors in two layers and shows the array as seen from the thickness direction of the plates (dotted lines show top layer, while solid lines show array of bottom layer adjoining the same).

FIG. 8 gives views of another example of a plate-shaped superconductor and a plate-shaped low resistance conductor obtained by connecting the same. (a) shows an example of a rectangular plate-shaped superconductor. (b) shows an example of a plate-shaped low resistance conductor obtained by alternately connecting rectangular plate-shaped superconductors in two layers and shows the array as seen from the normal direction of the plates (dotted lines show top layer, while solid lines show array of bottom layer adjoining the same).

FIG. 9 gives views of another example of a plate-shaped superconductor and a plate-shaped low resistance conductor obtained by connecting the same. (a) shows an example of an arcuate plate-shaped superconductor. (b) shows an example of an arcuate low resistance conductor obtained by connecting arcuate plate-shaped superconductors (dotted lines show top layer, while solid lines show array of bottom layer adjoining the same). (c) shows an example of a cylindrical low resistance conductor obtained by alternately stacking arcuate plate-shaped superconductors.

FIG. 10 gives views of an example of a low resistance conductor of another shape. (a) shows an example of a block-shaped low resistance conductor obtained by alternately connecting rectangular plate-shaped superconductors in multiple layers. (b) shows a hollow semispherical low resistance conductor obtained by being cut out from the block-shaped low resistance conductor and hollowed out.

FIG. 11 is a view of an example of a coil obtained by combining and connecting bent members and bar-shaped members. (a) shows the state as seen from the front surface (black portions are two types (long and short) of bar-shaped superconductor members). (b) shows the state seen from the rear surface (black portions are bent members. May be formed from one type except for hatched member).

FIG. 12 is a view of the current distribution at the time of passing a current through the conductor. (a) shows the current distribution when passing a current through a homogeneous good conductor. (b) shows the current distribution when connecting a superconductor to a homogeneous normal conductor.

FIG. 13 gives views of examples of composite conductors. (a) shows a composite conductor obtained by connecting a plurality of superconductors to a normal conductor. (b) shows a composite conductor obtained by connecting superconductors in a zig-zap manner to a normal conductor.

FIG. 14 is a view of the relationship between the bar-shaped superconductor fabricated in Example 1 and the crystal orientation.

FIG. 15 gives views schematically showing the cross-sectional shapes of low resistance conductors obtained by connecting pluralities of superconductors. (a) shows the cross-sectional shape of a low resistance conductor obtained by alternately connecting superconductors in two parallel rows. (b) shows the cross-sectional shape of a low resistance conductor obtained by alternately connecting superconductors in three parallel rows. (c) shows the cross-sectional shape of a low resistance conductor obtained by alternately connecting superconductors in three parallel rows.

FIG. 16 gives views of an example of a member. (a) shows an example of a bent member. (b) shows an example of a curved member.

FIG. 17 gives views of the mode of the arrangement of a low resistance conductor in a triple pipe. (a) shows the cross-section of the triple pipe and the low resistance conductor arranged in the triple pipe. (b) shows the structure of the connectable triple pipe end.

FIG. 21 gives views of the modes of composite conductors obtained by connecting superconductors. (a) shows a composite conductor obtained by serially connecting three bar-shaped superconductors to a normal conductor. (b) shows a composite conductor obtained by connecting a plurality of bar-shaped superconductors in a zig-zag manner to a normal conductor. (c) shows a composite conductor obtained by connecting three plate-shaped superconductors to a normal conductor.

BEST MODE FOR CARRYING OUT THE INVENTION

The present invention provides a conductor having a finite electrical resistance obtained by connection relatively simply through a normal conductor and a process for production of the same. Technology for connection of a plurality of bulk superconductors by superconductivity is disclosed in Japanese Unexamined Patent Publication (Kokai) No. 5-279028, Japanese Unexamined Patent Publication (Kokai) No. 6-40775, and Japanese Unexamined Patent Publication (Kokai) No. 7-17774. The above superconducting connections, however, connect crystals themselve without grain boundaries or weak bonds and requires alignment of the crystal orientation three-dimensionally.

As opposed to this, the present invention does not require three-dimensional alignment of the orientation of the crystal of the superconducting phase. Therefore, the conductor is extremely easy to manufacture and the efficacy in industry is extremely great.

Note that the low resistance conductor in the present invention does not exhibit the properties of a good conductor at a temperature above the superconducting transition temperature, but is called a "low resistance conductor" in the present invention even in that case.

Below, the explanation will be given classifying low resistance conductors into the three types of (1) low resistance conductors of wire-shaped and/or bar-shaped conductors obtained by connection by normal conductivity of a plurality of superconductors two-dimensionally, (2) low resistance conductors of plate-shaped and/or block-shaped conductors obtained by connection by normal conductivity of a plurality of superconductors three-dimensionally, and (3) composite conductors obtained by connecting at least one superconductor to part or all of the surface of a normal conductivity conductor.

Figure 1:
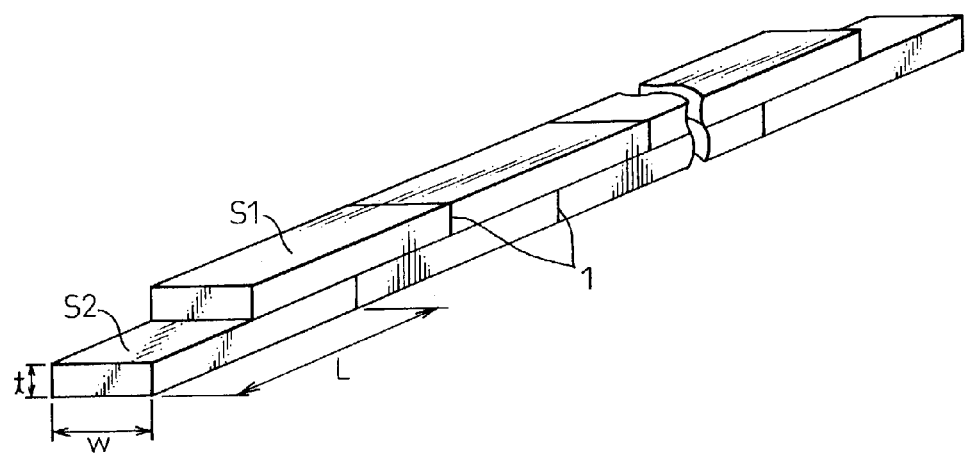
FIG. 1 is a view of an example of a low resistance conductor obtained by alternately connecting superconductors in two parallel rows.

(1) Low Resistance Conductors of Wire-Shaped and/or Bar-Shaped Conductors Obtained by Connection by Normal Conductivity of a Plurality of Superconductors Two-Dimensionally Consider a sufficiently long conductor obtained by connecting plate-shaped superconductor wires of lengths L (m), thicknesses t (m), and widths w (m) as shown in FIG. 1 through a normal conductivity substance having a thickness d (m) sufficiently thin compared with t. The connection resistance $R_j$ ($\Omega$) of the superconductors 1 (S1) and superconductors 2 (S2) is the sum of the contact resistance $R_{c1}$ between S1 and the normal conductor, the contact resistance $R_{c2}$ of S2 and the normal conductor, and the electrical resistance of the normal conductor, so is expressed by:

$$R_j = R_{c1} + R_{c2} + R_n$$

If the contact resistivity of the superconductors and the normal conductor is $\rho_c$ ($\Omega m^2$), then $$R_{c1} + R_{c2} = 4\rho_c/Lw$$

Further, if the specific resistance of the normal conductor is $\rho_n$ ($\Omega$m), then $R_n$ is $$R_n = \rho_n 2d/Lw$$

When the current carried is sufficiently small compared with the critical current of the superconductors, that is, when assuming that the voltage drop in the superconductors is zero, the resistance R of the conductor of a length nL is $$R = 2nR_j$$

Therefore, the apparent specific resistance $\rho^*$ ($\Omega$m) of this conductor in the longitudinal direction below the superconducting transition temperature of the superconductors is $$\rho^* = 2nR_j S/nL$$

Further, the apparent sectional area (S) is 2tw, so $$\rho^* = 4R_j tw/L$$
$$= 8t(2\rho_c + \rho_n d)/L^2$$

Here, however, the abutting portions 1 in the longitudinal direction shown in FIG. 1 are assumed to not be electrically connected.

Figure 2:
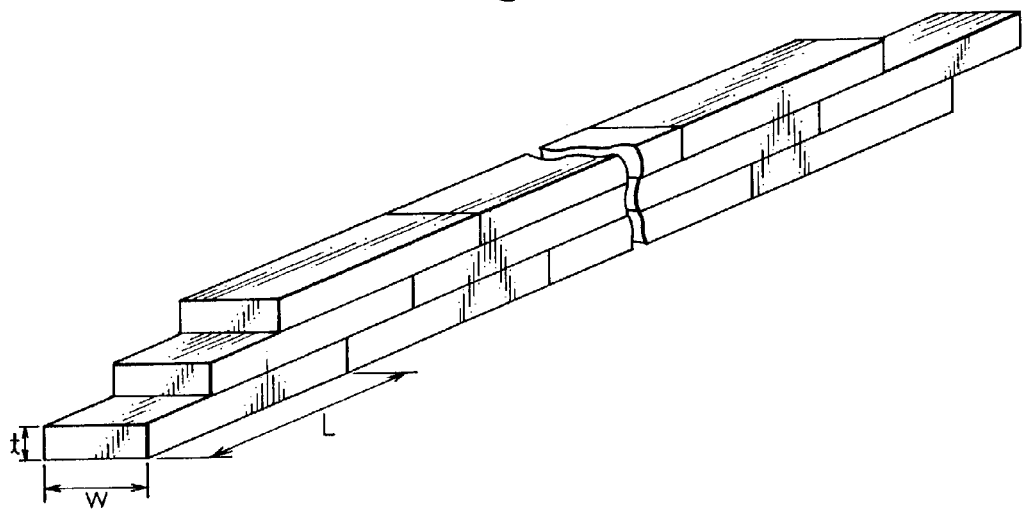
FIG. 2 is a view of an example of a low resistance conductor obtained by alternately connecting superconductors in three parallel rows.

Next, as shown in FIG. 2, similarly consider a conductor obtained by connecting plate-shaped superconductors in three parallel rows. Under the same conditions as when connecting them in two parallel rows, the $\rho^*$($\Omega$m) of the conductor becomes:

$$\rho^* = 27(2\rho_c + \rho_n d)t/4L^2$$

From these calculations, it is learned that the apparent $\rho^*$ is proportional to t and inversely proportional to the square of L and that the smaller the d, the smaller the $\rho^*$.

Figure 3:
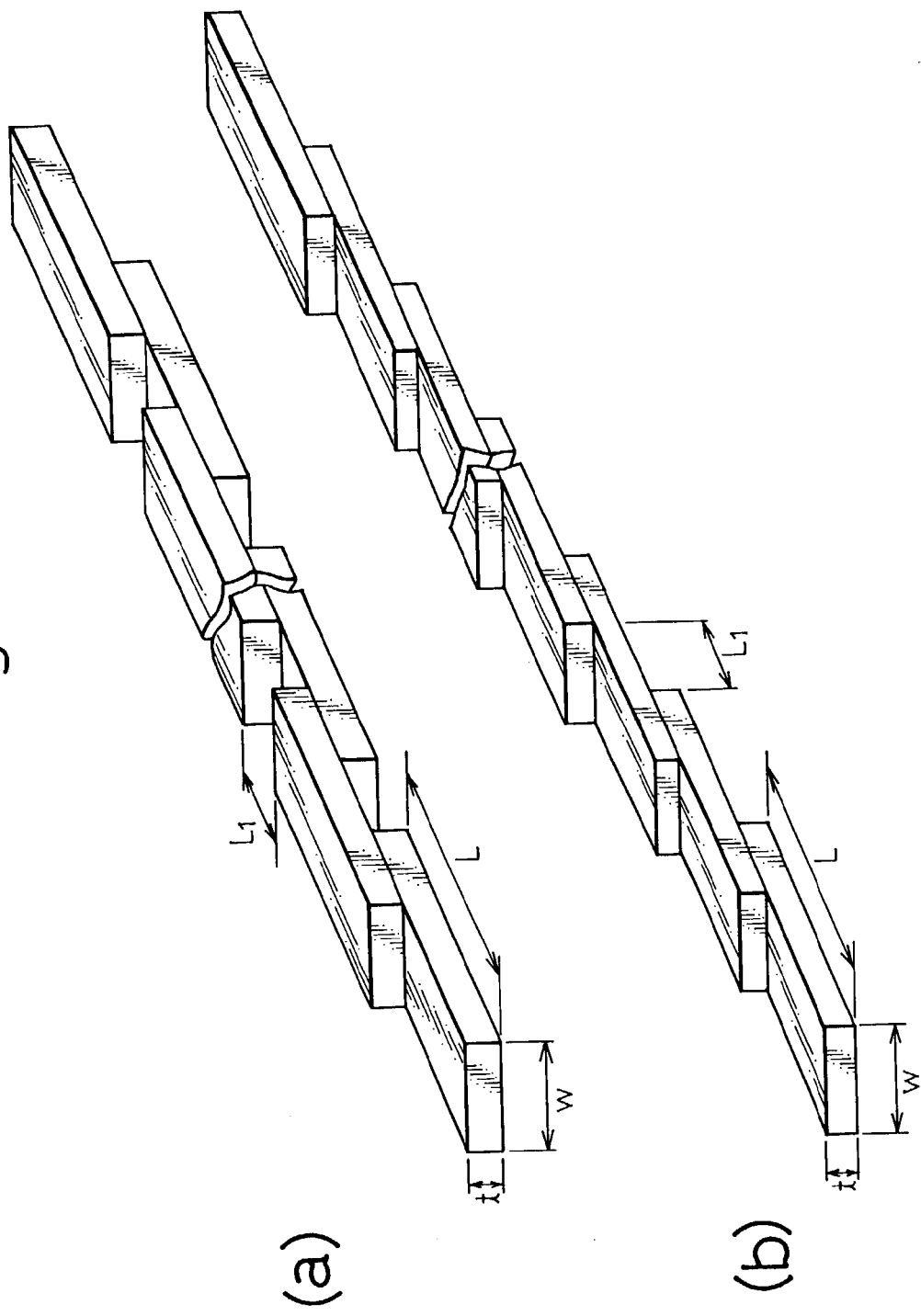
FIG. 3 gives views of examples of a low resistance conductor obtained by connecting superconductors alternately at L1 intervals. (a) shows an example of arrangement at the top and bottom. (b) shows an example of arrangement at the top.

Further, as shown in FIG. 3(*a*), similarly consider the case of constructing a conductor while leaving gaps of $L_1$. The $\rho^*$ in this case becomes $$\rho^* = 8(2\rho_c + \rho_n d)t/(L^2 - L_1^2)$$

While it is possible to increase the length by the same number of conductors, it is learned that the specific resistance ends up becoming larger. Further, in the conductor shown in FIG. 3(*b*) as well, it is learned that there is a similar tendency.

In practice, to maintain the mechanical strength, $L_1$ is preferably not more than 50% of L, more preferably not more than 10%. The most preferable mode is where $L_1$ is substantially zero and the conductors are electrically connected at a low resistance.

Arrangement of a plurality of layers of superconductors so as to cover the normal conductivity connections in the longitudinal direction of the superconductors means in this way that conductors with $L_1$ sufficiently smaller than L are arranged. In FIG. 1 to FIG. 3, bar-shaped superconductors having rectangular-shaped cross-sections were given as examples, but the sectional shapes do not have to be rectangular.

Further, arranging superconductors at intervals of $L_1$ and electrically connecting them is preferable since the mechanical strength is improved and the current carrying properties near the critical current are improved.

Various combinations of cross-sectional shapes of the conductors may also be considered. Specific examples are shown in FIG. 4.

Further, when the number of parallel rows is higher, the degree of the deterioration of properties affecting the conductor as a whole when there is a portion of a low critical current density (Jc) or other defect in one superconductor becomes smaller. Further, by giving conductivity to the abutted portions as well, the apparent specific resistance can, it goes without saying, be further lowered.

Figure 5:
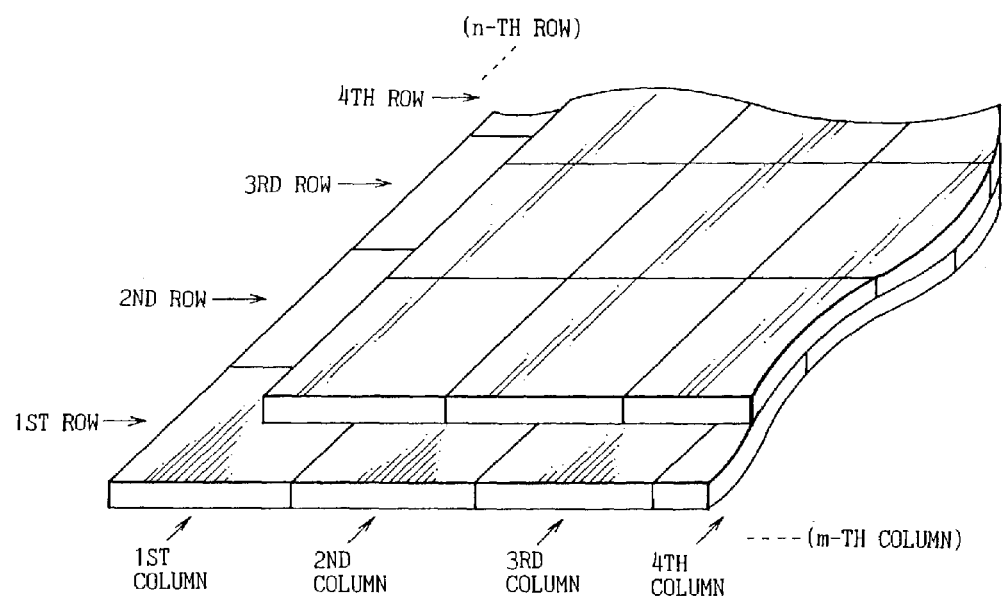
FIG. 5 is a view of an example of a plate-shaped low resistance conductor obtained by alternately connecting rectangular plate-shaped superconductors in two layers.

(2) Low Resistance Conductors of Plate-Shaped and/or Block-Shaped Conductors Obtained by Connection by Normal Conductivity of a Plurality of Superconductors Three-Dimensionally For a plate-shaped low resistance conductor obtained by connecting superconductors three-dimensionally, consider, for example, as shown in FIG. 5, a sufficiently broad conductor obtained by connecting plate-shaped superconductors of a length at each side of L (m) and a thickness t (m) in two layers through a normal conductivity phase of a thickness d (m) so as to cover connection locations. Here, assume that they are connected at the L×L surfaces and that they are not electrically connected at the thickness direction surfaces (L×t). Here, d is assumed to be sufficiently smaller than t.

Figure 6:
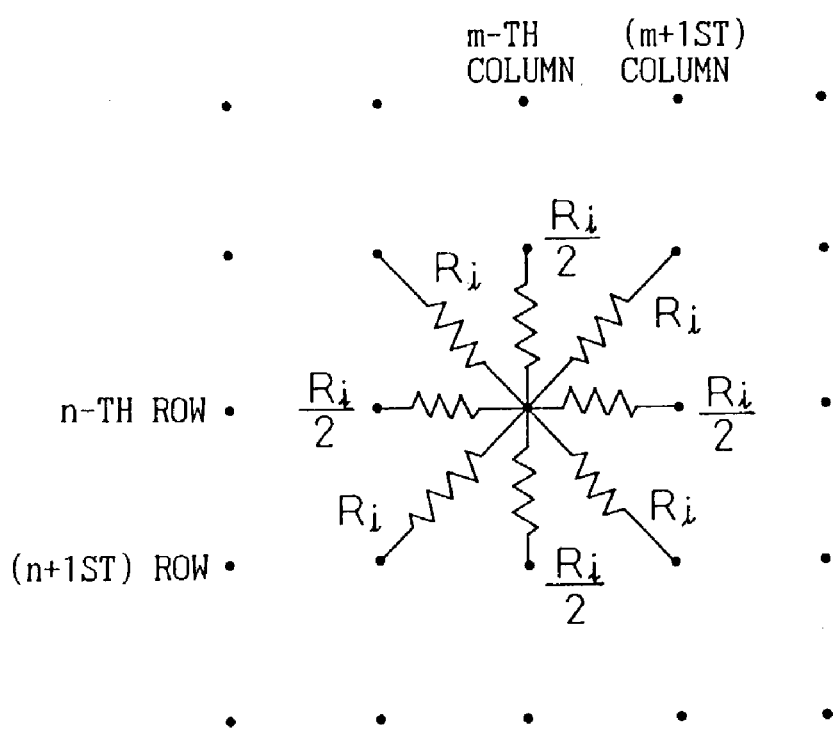
FIG. 6 is a view of an equivalent circuit of the resistance values of a plate-shaped low resistance conductor obtained by alternately connecting rectangular plate-shaped superconductors in two layers.

At this time, the m-th column n-th row superconductor is connected with the surrounding superconductors by the equivalent circuit shown in FIG. 6.

Further, the m-th column n-th row superconductor and the m+1st column n+1st row superconductor are connected by the connection area S (m$^2$), whereby the connection resistance $R_j$ ($\Omega$) is expressed as:

$$R_j = 2R_c + R_n$$

Here, $R_c$ is the contact resistance between a superconductor and normal conductor, while $R_n$ is the resistance of the normal conductor.

Further, $R_c$ and $R_n$ are respectively expressed as $$R_c = 2\rho_c/S$$
$$R_n = \rho_n d/S$$

Here, $\rho_c$ is the contact resistivity between the superconductors and the normal conductor, $\rho_n$ is the specific resistance of the normal conductor, and S is the contact area.

Further, S becomes as follows when assuming superposition at square surfaces of L/2 sides:

$$S = L^2/4$$

Therefore, the apparent specific resistance $\rho^*$ ($\Omega$m) at below the superconducting transition temperature in the in-plane direction of a plate-shaped conductor comprised of about 2 (m×n) superconductors becomes:

$$\rho^* = (R_j m/4n) \cdot 2tnL/mL$$
$$= R_j t/2$$
$$= (2\rho_c + \rho_n d)2t/L^2$$

From these calculations, it is learned that the apparent specific resistance is proportional to the thickness of the superconductors and inversely proportional to the square of the length of one side of the superconductors and that the smaller the d, the smaller the apparent specific resistance. Further, it can be supposed that there is a similar trend even if the coefficients change somewhat due to the number of the layers stacked and the method of bundling.

Further, in the low resistance conductor shown in FIG. 5, superconductors of sides L were densely packed together, but it is possible to similarly connect them while providing gaps $L_1$ to produce a plate-shaped low resistance conductor. In this case, there is the advantage that a broader area low resistance conductor can be obtained using the same number of superconductors, but the apparent specific resistance increases.

When connecting with such gaps $L_1$, in practice, to maintain the mechanical strength, $L_1$ is preferably not more than 50% of L, more preferably not more than 10%. The most preferable mode is where the $L_1$ is substantially zero and the conductors are electrically connected at a low resistance.

In FIG. 5, plate-shaped superconductors of square shapes of sides L were mentioned as an example, but the superconductors may be of any shape. Further, arranging superconductors at intervals of $L_1$ and electrically connecting them is preferable since the mechanical strength is improved and the current carrying properties near the critical current are improved.

Various cases may be considered for the mode of stacking in this low resistance conductor. Specific examples are shown in FIG. 7 to FIG. 10.

FIG. 7 shows a low resistance conductor obtained by densely packing regular hexagonal superconductors. In a low resistance conductor of this arrangement, the superconductors are arranged so that the superconductors of the top layer cover the contact points of three superconductors of the bottom layer.

FIG. 8 shows a low resistance conductor obtained by arranging rectangular plate-shaped superconductors with their longitudinal directions vertical at a top layer and bottom layer.

FIG. 9 shows a superconductor having a shape of a ring divided into three (FIG. 9(*a*)), an arcuate low resistance conductor where these are arranged to cover connections (FIG. 9(*b*)), and a cylindrical low resistance conductor obtained by stacking these (FIG. 9(*c*)). Such a low resistance conductor is suitable as an electromagnetic shield material since the inside of the cylinder is magnetically shielded.

FIG. 10(*a*) shows a low resistance conductor forming a block shape and having a broad area three-dimensionally obtained by stacking a large number of rectangular plate-shaped superconductors.

When the number of layers stacked is large, the degree of the deterioration of properties affecting the conductor as a whole when there is a portion of a low critical current density (Jc) or other defect in one superconductor becomes smaller. Further, if the thickness becomes large compared with the area of the plates, a block-shaped conductor is obtained. It then becomes possible to process this to prepare a low resistance conductor having various three-dimensional shapes. FIG. 10(*b*) shows a hollow semispherical conductor cut out from the block of FIG. 10(*a*).

Further, by giving a current carrying ability to the abutted portions, the apparent specific resistance can, it goes without saying, be further lowered.

As explained above, in a low resistance conductor of a wire-shaped, bar-shaped, plate-shaped, and/or block-shaped conductor obtained by connecting a plurality of superconductors by normal conductivity two-dimensionally and three-dimensionally, to reduce the apparent specific resistance further, it is sufficient in theory to further reduce the thickness (t) of the superconductors.

The actual thickness of the superconductors is at least the 20 μm of the thickness level of a sheet of a Y-based monocrystalline superconductor sample, preferably at least the 100 μm which can be obtained by grinding, more preferably the at least 200 μm which obtained easily by slicing. Further, the upper limit of the thickness is not particularly limited, but a thickness of not more than 10 mm is preferable in relation to the apparent specific resistance.

When connecting superconductors by normal conductivity in this way, at a cooling temperature of below the superconducting transition temperature, the resultant conductor has various advantages as a low resistance conductor when the apparent specific resistance of the conductor becomes smaller than the specific resistance of copper at that cooling temperature. In particular, the $\rho^*$ near 77K obtained when using liquid nitrogen as a coolant from the viewpoint of the convenience in cooling becomes an important parameter showing the usefulness of the conductor.

As explained above, the present invention relates to a conductor having a finite electrical resistance obtained by relatively simple connection and a process of production of the same. On the other hand, technology for connection of a plurality of bulk superconductors by superconductivity arranges a plurality of superconductors through solder with their crystal orientations aligned and heat treats them to cause crystal growth of the superconductors through the solder portions so as to create a monocrystalline structure and thereby connect the same. Three-dimensional alignment of the crystal orientations of the superconductors is basically required.

As opposed to this, the present invention does not require that the crystal orientations of the superconductor phases be aligned three-dimensionally. Further, by making the $\rho^*$ sufficiently small, it is possible to obtain similar efficacy as with a substantially complete superconductor.

To reduce the $\rho^*$ of the low resistance conductor in this way, it is necessary to increase the substantive contact area between superconductors. Therefore, it is preferable to make the superconductors bar-shaped or plate-shaped and bring into contact the adjoining superconductors at their surfaces approximately perpendicular to and surfaces approximately parallel with their longitudinal directions. Further, to change the current carrying direction, it becomes necessary to make them curved and bent bar shapes or plate shapes.

The superconductor materials forming the low resistance conductor may also be thin film superconductors having substrates or wire-shaped or tape-shaped superconductors having metal sheaths. Preferably, they are monocrystalline materials not including grain boundaries reducing the critical current.

In particular, a $REBa_2Cu_3O_{7-x}$ based superconductor having an $RE_2BaCuO_5$ phase finely dispersed in it and having a high critical current density is preferable. Such a superconductor is susceptible to microcracks perpendicular to the c-axis, so it is preferable that the longitudinal direction forming the current carrying direction be perpendicular to the c-axis. Further, the fact that making the longitudinal direction the current carrying direction results in a drop in the $\rho^*$ is clear from the equations relating to $\rho^*$ given above.

As the metal for direct contact with the superconductors, it is possible to use one or more of copper, a copper alloy, silver, a silver alloy, gold, a gold alloy, aluminum, or an aluminum alloy. In particular, it is preferable to use one or more of silver, a silver alloy, gold, and a gold alloy which have low oxidizability at a high temperature, are good in electrical compatibility with a superconductor, and are low in contact resistance.

Figure 24:
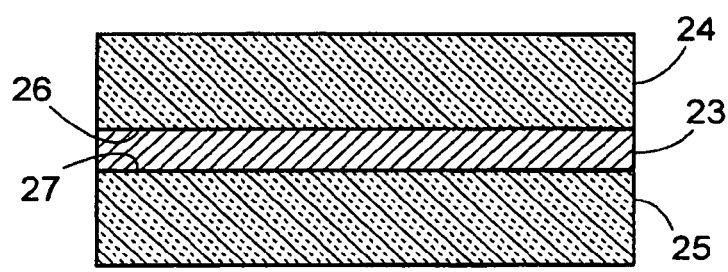
FIG. 24 is a schematic cross-sectional view of a low resistance conductor wherein a metal normal conductivity connection is a joint between faces substantially parallel to the longitudinal direction of adjoining superconductors.
Figure 25:
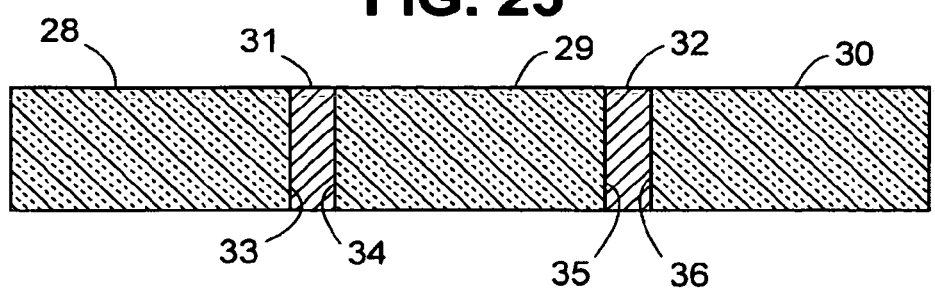
FIG. 25 is a schematic cross-sectional view of a low resistance conductor wherein metal normal conductivity connections are joints between faces substantially perpendicular to the longitudinal direction of adjoining superconductors.

FIG. 24 is a schematic cross-section view of a low resistance conductor wherein a metal normal conductivity connection 23 is a joint between faces 26, 27 substantially parallel to the longitudinal direction of adjoining superconductors 24, 25. FIG. 26 is a schematic cross-section view of a low resistance conductor wherein metal normal conductivity connections 31, 32 are joints between faces 33, 34 and faces 35, 36 substantially perpendicular to the longitudinal direction of adjoining superconductors 28, 29 and 30.

Further, covering the superconductors with the above metals with relatively small contact resistances and then connecting them by a suitable method later is advantageous in the production process. In this case, as the material for connecting the metal-covered superconductors, there is solder comprised mainly of tin and lead or a silver paste or other metal paste.

Solder is superior in the point of being able to be processed by simple work such as enabling easy connection by local heating at room temperature. In the case of soldering, the thickness of the metal layer at the connections usually becomes about 100 to 50 µm.

Further, a silver paste or other binder also is superior in the following points. When using a silver paste as a binder and performing heat treatment to cause sintering, due to the small specific resistance of the silver itself and the fact that the metal layer of the connections shrinks due to the sintering, a thin metal layer of less than 25 µm can be obtained and therefore the connection resistance can be reduced as compared with soldering. In the sintering step, heat treatment in a reduced pressure atmosphere or a vacuum is preferable from the viewpoint of the elimination of voids.

The normal conductivity connections between the superconductors are preferably thinner. When directly bringing superconductors into contact, however, the contact resistance conversely becomes larger. A thickness of not more than 10 mm is preferable, while not more than 1 mm is more preferable. In practice, while related to the surface roughness of the superconductors as well, an average value of 100 to 2 µm is preferable. More preferable is 50 to 2 µm. Still more preferable is 25 to 2 µm.

The low resistance conductor functions as a current lead when attaching electrodes etc. at its two ends. As the electrode material, the small specific resistance copper, aluminum, silver, etc. are preferable.

By arranging a cooled low resistance conductor in a heat insulating layer, it is possible to form a power feed cable. Here, "cable" means a conductor comprised of a low resistance conductor surrounded by a heat insulating layer. A conductor comprised of a low resistance conductor having electrodes at its two ends will be referred to as a "current lead".

Further, when using a low resistance conductor to prepare a coil, it is possible to produce a cylindrical coil similar to a conventional wire by piecing together arcuate superconductors, but producing a coil using straight superconductors and bent members of angles of 360 degrees divided by n etc. (at least two types of members) is extremely efficient in terms of the production process.

FIG. 11 shows an example of a coil using bent members of bent angles of 45 degrees (n=8). In this case, except for one bent member, this is comprised of three types of superconductors (short bar-shaped member 2, long bar-shaped member 3, and bent member 4).

In general, the Jc falls in a strong magnetic field, so it is efficient to use relatively thick conductors at the inside of the coil and relatively thin conductors at the outer circumference. Further, the Jc property in a magnetic field differs depending on the composition of the rare earth elements, so it is preferable to select the composition of the rare earth elements in accordance with the properties of the superconductors, for example, to use a material having a high critical current density in a low magnetic field at the outer circumference and use a material having a high critical current density in a high magnetic field at the inner circumference.

When passing a current through a coil, an electromagnetic force acts on the low resistance conductor, so it is necessary to reinforce the coil by a resin or fiber-reinforced plastic etc. Further, for efficient heat discharge, it is preferable to provide cooling paths through which a coolant etc. can flow.

By using a coil comprised of the above low resistance conductor at the secondary side with a low turn ratio, it is possible to produce a transformer able to carry a large current at the secondary side. Such a transformer can function as an AC power source able to carry a large current.

(3) Composite Conductors Obtained by Connecting at Least One Superconductor to Part or All of the Surface of a Normal Conductivity Conductor As shown in FIG. 12(a), when passing a current through a normal conductivity conductor such as a good conductor of copper, a copper alloy, aluminum, an aluminum alloy, silver, a silver alloy, gold, or a gold alloy, the current carried flows substantially uniformly through the conductor so that the resistance value becomes minimum.

As shown in FIG. 12(b), when electrically connecting all or part of a superconductor to the surface of a normal conductivity conductor and cooling this assembly to below the superconducting transition temperature of the superconductor, the current carried does not flow uniformly through the conductor as a whole. It flows with a higher current density at the superconductor with its zero resistance so that the resistance value of the conductor as a whole becomes minimum.

The ratio of the current flowing through the superconductor changes depending on the contact resistance between the superconductor and normal conductivity conductor, the critical current of the superconductor, the specific resistance of the normal conductivity conductor, etc. When passing a current of less than the critical current of the superconductor, the smaller the contact resistance or the larger the specific resistance of the normal conductivity conductor, the greater the ratio of current flowing through the superconductor. The greater the current flowing through the superconductor with its zero electrical resistance, the smaller the resistance of the composite conductor as a whole and accordingly the smaller the heat generated in the composite conductor.

To reduce the contact resistance between the superconductor and normal conductivity conductor, it is sufficient to increase the contact area. It is preferable that at least one of the superconductor and normal conductivity conductor have a flat surface and be connected at the flat surface. Further, to increase the surface area per volume, it is preferable that at least one of the superconductor and normal conductivity conductor have a bar shape or plate shape and that the entirety of at least one surface of the superconductor be joined with the normal conductivity conductor.

The superconductor is preferably by material an $REBa_2Cu_3O_{7-x}$ based superconductor (here, RE being one or more rare earth elements including Y). A bulk material having the structure of monocrystalline $REBa_2Cu_3O_{7-x}$ in which $RE_2BaCuO_5$ is finely dispersed is preferable. Further, since microcracks easily form in the a-b plane, the c-axis of the monocrystalline $REBa_2Cu_3O_{7-x}$ superconducting phase is preferably perpendicular to the longitudinal direction of the bulk superconductor.

When arranging a plurality of superconductors on the surface of a normal conductivity conductor, as shown in FIG. 13(a), it is preferable to arrange them in series. Further, preferably, it is preferable to arranging a string of a plurality of superconductors in a zig-zag manner as shown in FIG. 13(b) to reduce the gaps between superconductors (d and g in the figure) and ensure that as large a current as possible flows through the superconductors.

As the material of the normal conductivity conductor, the inexpensive and low resistivity copper, copper alloy, aluminum, aluminum alloy, silver, silver alloy, gold, or gold alloy is particularly preferable. Further, from the viewpoint of the oxidation resistance and from the viewpoint of the reduction of weight, aluminum is superior.

The coefficient of thermal expansion of a normal conductivity conductor and the coefficient of thermal expansion of a superconductor generally differ. Further, the temperature at the time when the superconductor and normal conductivity conductor are connected and the temperature at the time when the connected conductors are cooled generally differ. Therefore, stress acts in the superconductor and normal conductivity conductor. When this stress is large, the conductor may warp or the superconductor may break. Therefore, a symmetrical arrangement is preferable so that the stresses of connection of superconductors to the surface of the normal conductivity conductor are symmetrically balanced. Further, use of a high rigidity material to reinforce the low resistance composite conductor itself is further preferable.

The contact resistance between a superconductor and silver or a silver alloy can be reduced relatively easily. Therefore, it is preferable to provide a silver coating on the surface of the superconductor in advance and to connect the surface having the coating to the surface of the normal conductor.

When connecting such a superconductor to a normal conductivity conductor using solder etc., since solder generally has a large rspecific resistance compared with good conductors such as copper, silver, and aluminum, the solder or other metal layer present between the superconductor and normal conductivity conductor is preferably as thin as possible. Specifically, it is made not more than 100 μm obtained by connection in the pressed state.

The methods of connecting a superconductor and normal conductivity conductor may be roughly divided into the method using solder mainly comprised of tin and lead and the method using silver paste or another metal paste. Solder is superior in the point of being able to be processed by simple work such as enabling easy connection by local heating at room temperature.

In the case of soldering, the thickness of the metal layer at the connections is normally 100 to 50 μm or so. Further, a silver paste or other binder is also superior in this point. When using a silver paste as a binder and causing sintering by heat treatment, due to the small specific resistance of the silver itself and the shrinkage of the metal layer at the connections due to the sintering, a thin metal layer of less than 25 μm can be obtained, so the connection resistance can be reduced compared with soldering. In this sintering step, heat treatment in a reduced pressure atmosphere or a vacuum is preferable from the viewpoint of the elimination of voids.

The above-mentioned low resistance composite conductor has a small resistance and a small heat buildup, so can be used as a current carrying member or current lead for passing current through a superconductor or superconductor coil.

Further, such a current lead is superior as a lead of a superconductor transformer or direct cooling or conduction cooling type superconductor magnet or other magnetic field generating apparatus requiring cooling to less than the superconducting transition temperature.

EXAMPLE 1

Source powders of $Y_2O_3$, $BaO_2$, and $CuO$ were mixed to give a molar ratio Y:Ba:Cu of the metal elements of 13:17:24, then 0.5 wt % of Pt was added to the mixed powder to prepare a mixed source powder. This source powder was calcined at 900° C. in a flow of oxygen. The calcined powder was then shaped into a disk-shaped article of a diameter of 55 mm and a thickness of 20 mm at a pressure of 2 tons/cm$^2$ using a rubber press.

The disk was raised in temperature in the atmosphere to 1150° C. over 8 hours and held there for 1 hour. Next, an Sm-based seed crystal was used and the seed crystal arranged so that the normal of the disk surface substantially matched the c-axis. Suitably thereafter, the disk was lowered in temperature to 1005° C. over 30 minutes and further was gradually cooled to 970° C. over 220 hours so as to grow the crystal. Next, the disk was cooled to room temperature over 20 hours.

The obtained approximately 46 mm diameter columnar Y-based bulk material was sliced to a thickness of 0.6 mm and processed to a width of 2.0 mm and a length of 40 mm to prepare bar-shaped samples (bar-shaped superconductors). The thus obtained materials had the structure of monocrystalline $YBa_2Cu_3O_{7-x}$ in which an approximately 1 μm $Y_2BaCuO_5$ phase was finely dispersed. The relationship between the bar-shaped samples (bar-shaped superconductors) and the crystal orientation of the $YBa_2Cu_3O_{7-x}$ phase is shown in FIG. 14.

The surfaces of the bar-shaped samples were formed with films of silver of thicknesses of about 2 μm by sputtering, then annealed in a flow of oxygen. The annealing was performed by raising the samples in temperature from room temperature to 600° C. over 6 hours and holding them there for 1 hour, then lowering them in temperature to 450° C. over 2 hours, further lowering them in temperature to 380° C. over 60 hours, then cooling them to room temperature over 12 hours.

These bar-shaped samples were then electrically connected in arrangements shown in FIG. 1 using solder containing silver to produce approximately 1 m low resistance conductors having the cross-sections shown in FIGS. 15(a) to (c). At this time, with normal soldering, the thickness of the metal layer would become about 100 μm, but by causing the solder to solidify while applying pressure, it was possible to reduce the thickness of the metal layers to about 50 μm. Further, current introducing terminals and voltage terminals were attached to the low resistance conductors produced by these connection methods, then the conductors were immersed in liquid nitrogen to bring the superconductors to the superconducting state.

500 A of current was passed through the above three types of low resistance conductors to measure the resistances, whereupon they were found to be $1.25 \times 10^{-5}$ Ω, $0.69 \times 10^{-5}$ Ω, and $0.75 \times 10^{-5}$ Ω. The apparent resistivities were respectively $3.0 \times 10^{-11}$ Ωm, $2.5 \times 10^{-11}$ Ωm, and $2.7 \times 10^{-11}$ Ωm. Compared with the resistivity of copper at the liquid nitrogen temperature (77K) ($2.5 \times 10^{-9}$ Ωm), it was learned that resistivities of two orders lower were exhibited.

EXAMPLE 2

Changing only the $Y_2O_3$ in the source powder to $Dy_2O_3$, the same method as in Example 1 was used to prepare a Dy-based bulk material. This was sliced to a thickness of 0.6 mm, then processed to bar-shaped materials such as shown in FIG. 14 and bar-shaped materials having curved and bent shapes such as shown in FIG. 16(*a*) and FIG. 16(*b*).

These were coated with silver on their surfaces in the same way as with Example 1, then assembled to prepare L-shaped low resistance conductors of total lengths of about 1 m. At this time, the superconductors were connected with each other in the arrangement shown in FIG. 1 in the same way as in Example 1 using solder. At the connections at this time, the coating layers of silver were 5 μm thick and the solder layers were about 50 μm thick.

500 A of current was passed through the above two types of low resistance conductors to measure the resistances, whereupon they were found to be both approximately $1.3 \times 10^{-5}$ Ω. The apparent resistivities were $3.0 \times 10^{-11}$ Ωm. Compared with the resistivity of copper at the liquid nitrogen temperature (77K), it was learned that resistivities of two orders lower were exhibited.

Such a cable or conductor functions as a current lead.

EXAMPLE 3

The ends of a low resistance conductor 8 prepared in Example 1 were connected with copper electrodes, then the conductor was given an insulation coating 5, then inserted into a triple pipe as shown in FIG. 17(*a*). The end where the triple pipe is connected in series (comprised of the flange 9 and O-ring 10) had the structure shown in FIG. 17(*b*). This had the copper electrode 11 insulated from the surroundings and the liquid nitrogen channels 6 and 12 covered by a vacuum heat insulating layer 7.

Figure 18:
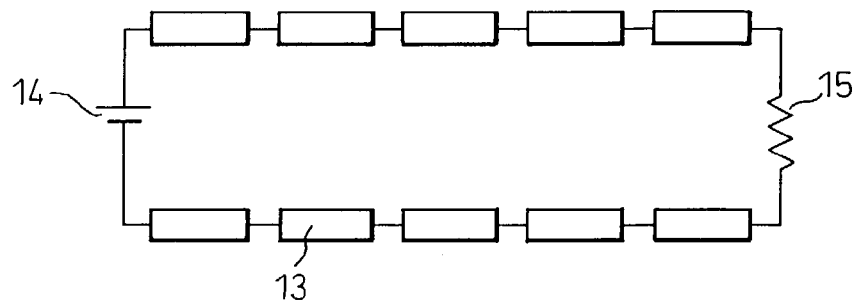
FIG. 18 is a view of a power feed experiment circuit.

Five of these cables 13 were connected in series and a load 15 and DC power source 14 connected so as to prepare the power feed experimental circuit shown in FIG. 18. 500 A was passed through the load 15, whereupon the power transmission loss occurring in one cable was about 3.2 W. Compared with the loss at room temperature of a copper wire having a thickness of the cable (outside diameter of triple pipe) (about 120 W), it was possible to reduce the loss to about 1/40th the level.

EXAMPLE 4

The methods described in Example 1 and Example 2 were used to prepare Y-based and Dy-based approximately 46 mm diameter columnar bulk materials. These were sliced to 1.0 mm thicknesses, then straight bar-shaped materials and 45 degree angle bent bar-shaped materials of widths of 1.9 mm were prepared from the Y-based material and of 2.2 mm were prepared from the Dy-based material. These were coated with silver, then infused with oxygen by the annealing method described in Example 1.

These were electrically connected by solder. At this time, the thicknesses of the solder layers were about 60 μm. Further, the thicknesses of the silver coatings were 5 μm.

Figure 19:
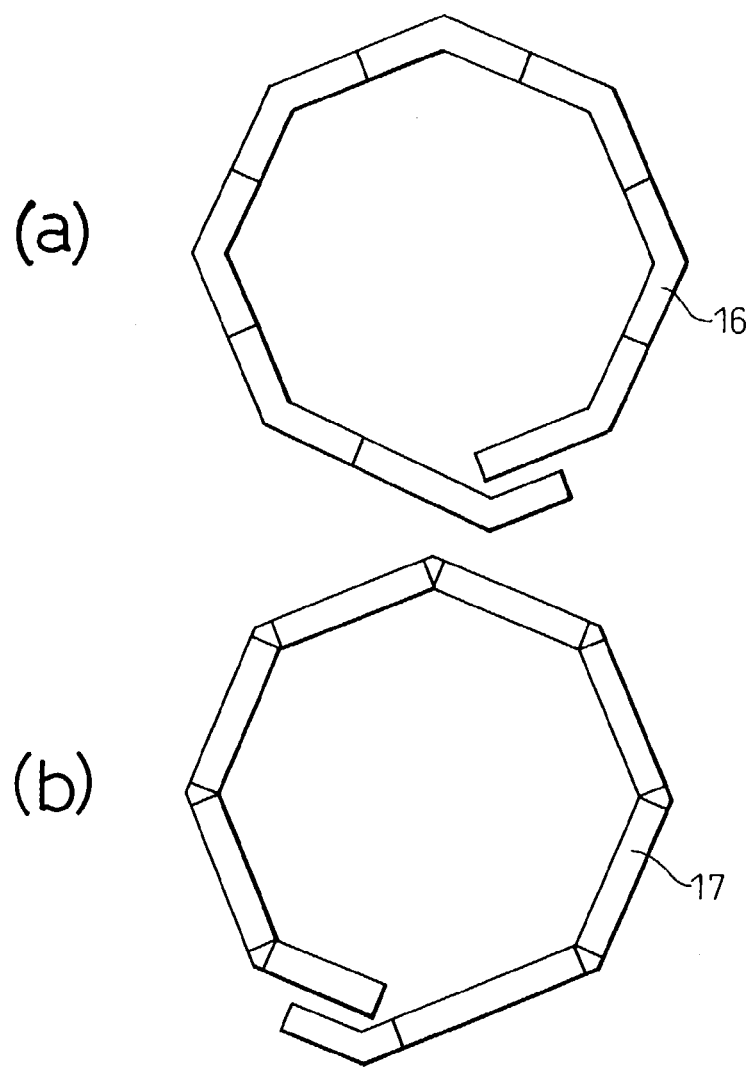
FIG. 19 gives views of an example of a secondary side low resistance coil used for a transformer. (a) shows a secondary side low resistance coil used for a transformer as seen from the front surface (bent members visible). (b) shows the secondary side low resistance coil used for a transformer seen from the rear surface (bar-shaped members visible).

Pancake coils (innermost diameter of 62 mm and outermost diameter of 138 mm) comprised of five turns of the 2.2 mm width conductor at the inside and 8 turns of the 1.9 mm width conductor at the outside were prepared by connecting bent members 16 and bar-shaped members 17 in the arrangements shown in FIG. 19(*a*) and FIG. 19(*b*) on glass fiber-reinforced plastic (FRP) of a thickness of 0.4 mm.

This FRP was provided with holes of diameters of 2 mm in a lattice arrangement. These holes served as liquid nitrogen channels. The FRP and conductors were bonded using a resin containing about 20 vol % of filler of several μm size. Thirty-one of these pancake coils were stacked and electrically connected in directions strengthening the magnetic fields produced by these pancake coils to prepare a multilayer coil of a height of about 80 mm. At this time, the direction of winding was reversed for each layer so as to enable the inside and outside terminals of these pancake coils to be connected.

A current introducing terminal was connected to the multilayer coil, then the coil was immersed in liquid nitrogen for cooling. When 500 A current was passed, the voltage generated in the coil was 1.5V and an approximately 2.0 T magnetic field was produced inside. At this time, there was no voltage rise due to heat buildup and there was no seizure of the coil even when carrying current for a long period.

In this way, it was learned that a powerful magnetic field can be simply produced by using a low resistance conductor.

EXAMPLE 5

The method described in Example 1 was used to prepare a Y-based about 46 diameter columnar bulk material. This was sliced to a thickness of 1.5 mm, then used to prepare straight bar-shaped materials and 45 degree angle bent bar-shaped materials of 3.0 mm widths. These were coated with silver, then infused with oxygen by the annealing method described in Example 1.

These were electrically connected by solder as shown in FIG. 19(*a*) and FIG. 19(*b*) to prepare a solenoid coil of 5 turns per layer (innermost diameter of 20 mm and outermost diameter of 26 mm). At this time, the thicknesses of the solder layers were about 45 μm, while the thicknesses of the silver coatings were 3 μm.

Figure 20:
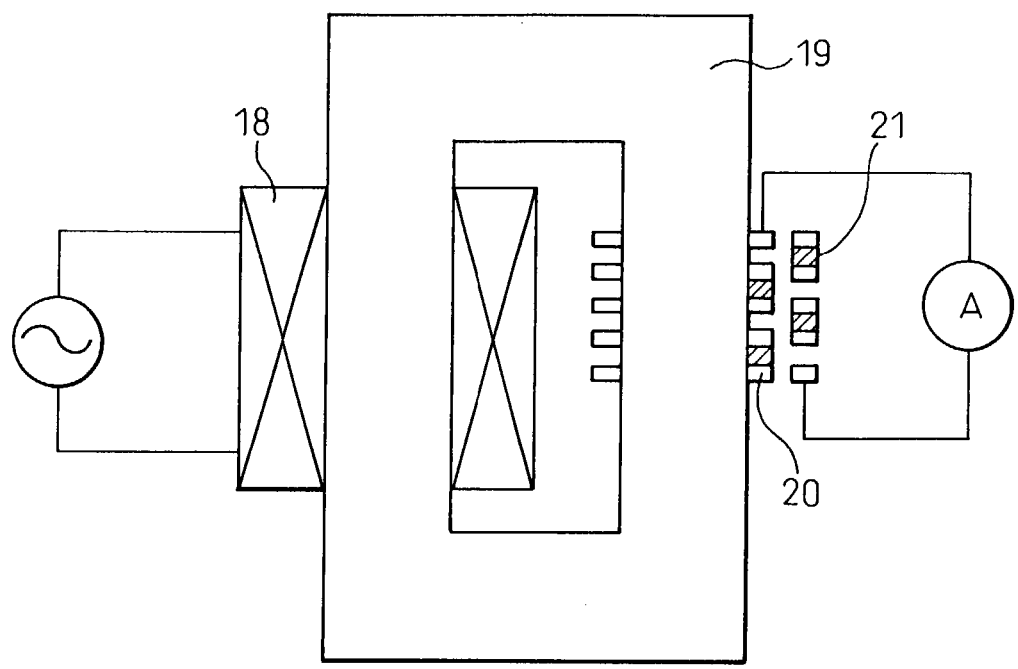
FIG. 20 is a view of the structure of a transformer using the low resistance conductors.

This, as shown in FIG. 20, was connected with an iron core 19 having a regular octagonal cross-section through a low resistance conductor 21 while crossing the same to make a secondary winding 20 of a transformer. As the primary winding 18, a covered copper wire was wound by 500 turns. This transformer was immersed in liquid nitrogen and a sine wave current of a peak value of 15 A was introduced at the primary side. It was confirmed that a sine wave of about 1500 A flowed at the secondary side. Due to this, it became clear that this transformer functioned as a power source able to carry a large current.

EXAMPLE 6

The surfaces of bar-shaped materials having the structure of monocrystalline $YBa_2Cu_3O_{7-x}$ phase in which an about 1 μm $Y_2BaCuO_5$ phase was finely dispersed, prepared in Example 1, were coated with films of silver of thicknesses of approximately 2 μm by sputtering, then these bar-shaped samples were connected using silver paste in arrangements shown in FIG. 1 to prepare low resistance conductors of about 1 m having the cross-sections shown in FIGS. 15(*a*) to (*c*).

These low resistance conductors were heated under a reduced pressure of about $1.3 \times 10^2$ Pa at about 900° C. for about 1 hour to cause the silver particles in the silver paste and the silver films on the surfaces of the bar-shaped materials to sinter. The thicknesses of the silver layers at this time were a total of about 25 μm.

Next, the conductors were annealed in a flow of oxygen. In detail, the conductors were raised in temperature from room temperature to 600° C. over 6 hours and held there for 1 hour, then lowered in temperature to 450° C. over 2 hours and further lowered in temperature to 380° C. over 60 hours, cooled to room temperature over 12 hours.

The conductors prepared by these connection methods were attached with current introducing terminals and voltage terminals, then immersed in liquid nitrogen to bring the superconductors to the superconducting state.

500 A was passed through the above three types of low resistance conductors to measure the resistances, whereby they were found to be $1.25 \times 10^{-6}$ Ω, $0.76 \times 10^{-6}$ Ω, and $0.72 \times 10^{-6}$ Ω. The apparent resistivities were $3.0 \times 10^{-12}$ Ωm, $2.8 \times 10^{-12}$ Ωm, and $2.7 \times 10^{-12}$ Ωm, respectively. Compared with the resistivity of copper at the liquid nitrogen temperature (77K) ($2.5 \times 10^{-9}$ Ωm), it was learned that resistivities three orders lower were exhibited.

EXAMPLE 7

An MgO substrate of a thickness of 0.5 mm was formed with a film of $YBa_2Cu_3O_{7-x}$ of a thickness of 1 μm and was further formed with, as a protective film, a film of silver (Ag) of a thickness of about 5 μm by sputtering. At this time, the c-axis of the $YBa_2Cu_3O_{7-x}$ was parallel to the normal of the substrate. This thin film material was processed to a width of 2.0 mm and a length of 40 mm to prepare bar-shaped samples. These bar-shaped samples were connected at their Ag film surfaces by a silver paste so that the substrates were at the outside as shown in FIG. 1 to thereby prepare a low resistance conductor of about 1 m having the cross-section shown in FIG. 15(a).

This low resistance conductor was heated under a reduced pressure of about $1.3 \times 10^2$ Pa at about 900° C. for about 1 hour to cause the silver particles in the silver paste and the silver films on the surface of the bar-shaped materials to sinter. The thickness of the silver layers at this time was a total of about 20 μm.

Next, the conductor was annealed in a flow of oxygen. In detail, the conductor was raised in temperature from room temperature to 600° C. and held there for 1 hour, then lowered in temperature to 450° C. over 2 hours and further lowered in temperature to 380° C. for 60 hours, cooled to room temperature over 12 hours.

The conductor prepared in this way was attached with a current introducing terminal and voltage terminal, then immersed in liquid nitrogen to bring the superconductors to the superconducting state.

10 A was passed through the above low resistance conductor to measure the resistance, which was found to be $1.25 \times 10^{-6}$ Ω. The apparent resistivity was $3.0 \times 10^{-12}$ Ωm. Compared with the resistivity of copper at the liquid nitrogen temperature (77K) ($2.5 \times 10^{-9}$ Ωm), it was learned that a resistivity about three orders lower was exhibited.

EXAMPLE 8

Source powders of $Y_2O_3$, $BaO_2$, and CuO were mixed to give a molar ratio Y:Ba:Cu of the metal elements of 13:17:24, then 0.5 wt % of Pt was added to the mixed powder to prepare a mixed source powder. This source powder was calcined at 900° C. in a flow of oxygen. The calcined powder was then shaped into a disk-shaped article of a diameter of 55 mm and a thickness of 20 mm at a pressure of 2 tons/cm² using a rubber press.

The disk was raised in temperature in the atmosphere to 1150° C. over 8 hours and held there for 1 hour. Next, an Sm-based seed crystal was used and the seed crystal arranged so that the normal of the disk surface substantially matched the c-axis. Suitably thereafter, the disk was lowered in temperature to 1005° C. over 30 minutes and further was gradually cooled to 970° C. over 220 hours so as to grow the crystal. Next, the disk was cooled to room temperature over 20 hours. The obtained material was sliced to a thickness of 1.0 mm, and 30 mm×30 mm×1 mm plate-shaped samples were prepared.

The thus obtained materials had the structure of monocrystalline $YBa_2Cu_3O_{7-x}$ in which an approximately 1 μm $Y_2BaCuO_5$ phase was finely dispersed. The c-axis of the $YBa_2Cu_3O_{7-x}$ phase corresponded to the normal (perpendicular to 30 mm×30 mm face) direction of the plates.

The surfaces of these plate-shaped samples were formed with films of silver of about 2 μm by sputtering, then annealed in a flow of oxygen. The annealing was performed by raising the samples in temperature from room temperature to 600° C. over 6 hours and holding them there for 1 hour, then lowering them in temperature to 450° C. over 2 hours, further lowering them in temperature to 380° C. over 60 hours, then cooling to room temperature over 12 hours.

These plate-shaped samples were then electrically connected in the arrangement shown in FIG. 5 using solder containing silver to produce an approximately 500 mm×500 mm×2 mm plate-shaped conductor. At this time, with normal soldering, the thickness of the metal layer would become about 100 μm, but by causing the solder to solidify while applying pressure, it was possible to reduce the thickness of the metal layer to about 50 μm. Further, a current introducing terminal and voltage terminal were attached to the front and back of the facing sides of the conductor prepared by this connection method, then the conductor was immersed in liquid nitrogen to bring the superconductors to the superconducting state.

Current was passed through the completed plate-shaped low resistance conductor to measure the resistance, whereupon the apparent specific resistance was found to be $3.2 \times 10^{-11}$ Ωm. Compared with the specific resistance of copper at the liquid nitrogen temperature (77K) ($2.5 \times 10^{-9}$ Ωm), it was learned that a specific resistance of about two orders lower was exhibited.

EXAMPLE 9

With just changing the $Y_2O_3$ in the source powder to $Dy_2O_3$, the same method as explained in Example 7 was used to prepare a Dy-based bulk material. This was sliced to a thickness of 0.6 mm, then processed to hexagonal plate-shaped materials with sides of a length of 25 mm as shown in FIG. 7(a). The surfaces of these plate-shaped samples were formed with films of silver of about 2 μm by sputtering. These were then arranged as shown in FIG. 7(b) to prepare an approximately 500 mm×500 mm×1.3 mm plate-shaped conductor. At this time, the plates were connected by coating a silver paste, then heating the plate-shaped conductor under a reduced pressure of about $1.3 \times 10^2$ Pa at about 900° C. for about 1 hour to cause the silver particles in the silver paste and the silver films on the surface of the bar-shaped materials to sinter. The thicknesses of the silver layers at this time were about 25 μm.

Next, the conductor was annealed in a flow of oxygen. In detail, the conductor was raised in temperature from room temperature to 600° C. over 6 hours and held there for 1 hour, then lowered in temperature to 450° C. over 2 hours, further lowered in temperature to 380° C. over 60 hours, then cooled to room temperature over 12 hours.

Current was passed through the completed plate-shaped low resistance conductor to measure the resistance, whereupon the apparent specific resistance was found to be $2.8 \times 10^{-11}$ Ωm. Compared with the specific resistance of copper at the liquid nitrogen temperature (77K) ($2.5 \times 10^{-0}$ Ωm), it was learned that a specific resistance of about two orders lower was exhibited.

EXAMPLE 10

The source powder of Example 7 was further mixed with about 15 wt % of silver powder and the same method as explained in Example 1 used to prepare a silver-containing Y-based bulk material. This was sliced to a thickness of 3.0 mm, then processed to the shapes of a ring of an inside diameter 40 divided into three as shown in FIG. 9(a).

The surfaces of these plate-shaped samples were formed with films of silver of about 2 μm by sputtering. These were then arranged as shown in FIG. 9(b) to prepare a ring-shaped conductor of a height of about 60 mm (FIG. 9(c)). At this time, the samples were connected by coating a silver paste, then heating the plate-shaped conductor under a reduced pressure of about $1.3 \times 10^2$ Pa at about 900° C. for about 1 hour to cause the silver particles in the silver paste and the silver films on the surfaces of the bar-shaped materials to sinter. The thicknesses of the silver layers at this time were about 25 μm.

Next, the conductor was annealed in a flow of oxygen. In detail, the conductor was raised in temperature from room temperature to 600° C. over 6 hours and held there for 1 hour, then lowered in temperature to 450° C. over 2 hours, further lowered in temperature to 380° C. over 60 hours, then cooled to room temperature over 12 hours.

A Hall element was arranged at the center of the obtained ring-shaped conductor, the assembly was cooled to the liquid nitrogen temperature (77K), then an AC magnetic field of a peak value of 0.4T and 0.1 Hz was applied from the outside. The direction of application of the magnetic field was made to correspond to the axial direction of the ring. At this time, the magnetic field at the center of the ring was less than 0.001T. It was learned that the inside of the ring was shielded from the magnetic field extremely well.

EXAMPLE 11

The $Y_2O_3$ in the source powder of Example 7 was changed to $Gd_2O_3$ and 15 wt % of silver added to prepare a disk-shaped article as prepared in Example 1.

This was raised in temperature in a nitrogen atmosphere containing 0.1 atomic percent of oxygen to 1150° C. over 8 hours and held there for 1 hour. Next, an Sm-based seed crystal was used and the seed crystal arranged so that the normal of the disk surface substantially matched the c-axis. Suitably thereafter, the disk was lowered in temperature to 1005° C. over 30 minutes and further was gradually cooled to 970° C. over 220 hours so as to grow the crystal. Next, the disk was cooled to room temperature over 20 hours. The obtained silver-containing Gd-based bulk material was sliced to a thickness of 1.0 mm, and 30 mm×20 mm×2 mm plate-shaped samples were prepared.

The thus obtained materials had the structure of a monocrystalline $GaBa_2Cu_3O_{7-x}$ in which an approximately 1 μm $Gd_2BaCuO_5$ was finely dispersed. The c-axis of the $GaBa_2Cu_3O_{7-x}$ phase corresponded to the normal (perpendicular to 30 mm×30 mm face) direction of the plates.

The surfaces of the plate-shaped materials were formed with films of silver of about 2 μm by sputtering, then the plate-shaped samples were connected in the arrangement shown in FIG. 10(a) using silver paste to prepare an approximately 200 mm×150 mm×100 mm block-shaped low resistance conductor.

The conductor was heated under reduced pressure of $1.3 \times 10^2$ Pa at about 900° C. for about 1 hour to cause sintering of the silver particles of the silver paste and the silver films on the surfaces of the bar-shaped materials. The thicknesses of the silver layers at that time were about 25 μm.

Next, the conductor was annealed in a flow of oxygen. In detail, the conductor was raised in temperature from room temperature to 600° C. over 6 hours, held there for 1 hour, then lowered in temperature to 450° C. over 2 hours, then further lowered in temperature to 380° C. over 60 hours, cooled to room temperature over 12 hours.

The completed block-shaped low resistance conductor was immersed in liquid nitrogen and measured for resistance in the longitudinal direction (200 mm direction of block-shaped conductor), whereupon the apparent specific resistance was $3.8 \times 10^{-11}$ Ωm. Compared with the specific resistance of copper at the liquid nitrogen temperature (77K) ($2.5 \times 10^{-9}$ Ωm), it was learned that a sufficiently low specific resistance was exhibited.

EXAMPLE 12

Source powders of $Y_2O_3$, $BaO_2$, and CuO were mixed to give a molar ratio Y:Ba:Cu of the metallic elements of 13:17:24, then 0.5 wt % of Pt was added to the mixed powder to prepare a mixed source powder. This source powder was calcined at 900° C. in an oxygen flow. The calcined powder was shaped using a rubber press to a disk-shaped article having a diameter of 55 mm and a thickness of 20 mm at a pressure of 2 ton/cm².

This disk was raised in temperature in the atmosphere to 1150° C. over 8 hours and held there for 1 hour. Next, an Sm-based seed crystal was used and the seed crystal arranged so that the normal of the disk surface substantially matched the c-axis at 1040° C. Suitably thereafter, the disk was lowered in temperature to 1005° C. over 30 minutes, then gradually cooled to 970° C. over 220 hours to grow the crystal. Next, this was cooled to room temperature over 20 hours. The obtained material was sliced to a thickness of 1.0 mm, and 30 mm×2 mm×1 mm bar-shaped bulk superconductor materials and 25 mm×8 mm×1 mm plate-shaped bulk superconductor materials were prepared.

The thus obtained materials had a structure of a monocrystalline $YBa_2Cu_3O_{7-x}$ phase in which a 1 μm or so $Y_2BaCuO_5$ phase was finely dispersed. Further, the c-axis of the $YBa_2Cu_3O_{7-x}$ phase corresponded to the plane normal of the bar surface and normal direction of the plate surface.

The surfaces of the plate-shaped samples were formed with films of silver of about 2 μm by sputtering, then annealed in a flow of oxygen. The annealing was performed by raising the materials in temperature from room temperature to 600° C. over 6 hours and holding them there for 1 hour, then lowering them in temperature to 450° C. over 2 hours, further lowering them in temperature to 380° C. over 60 hours, and cooling to room temperature over 12 hours.

These plate-shaped samples and plate-shaped samples were arranged as shown in FIGS. 21(a), (b), and (c) and electrically connected to 150 mm×8 mm×5 mm size copper normal conductivity conductors using solder containing silver to prepare low resistance composite conductors. At this time, with normal soldering, the thickness of the metal layer would become about 100 μm, but by causing the solder to solidify while applying pressure, it was possible to reduce the thicknesses of the metal layers to about 50 μm.

Further, the low resistance composite conductors prepared by these connection methods were attached with current introducing terminals and voltage terminals, then the conductors were immersed in liquid nitrogen to bring the superconductors to the superconducting state.

Current was passed through the completed low resistance composite conductors to measure the resistance at the liquid nitrogen temperature (77K). The apparent specific resistances were calculated and found to be $1.25 \times 10^{-9}$ Ωm, $1.0 \times 10^{-9}$ Ωm, and $0.56 \times 10^{-9}$ Ωm. The specific resistance in the case of just a copper normal conductivity conductor is $2.5 \times 10^{-9}$ Ωm, Compared with this specific resistance, it was learned that sufficiently low values were exhibited.

EXAMPLE 13

The $Y_2O_3$ in the source powder was changed to $Dy_2O_3$ and the same method as explained in Example 11 used to prepare a Dy-based bulk material. This was sliced to a thickness of 0.6 mm, then 30 mm×2.5 mm×0.6 mm bar-shaped samples were prepared. The thus obtained materials had a structure of a monocrystalline $YBa_2Cu_3O_{7-x}$ phase in which a 1 μm or so $Dy_2BaO_5$ phase was finely dispersed. Further, the c-axis of the $Dy_2BaCu_3O_{7-x}$ phase corresponded to the normal direction of the bar surfaces and normal direction of the plate surfaces.

Figure 22:
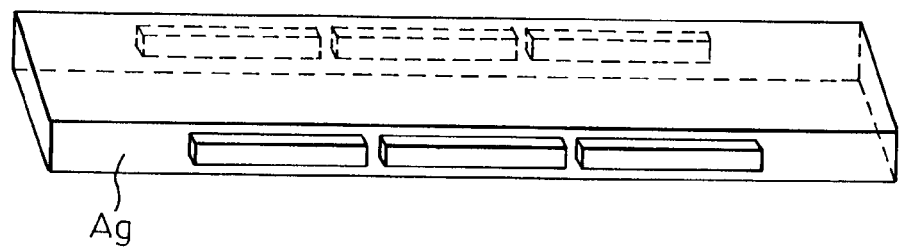
FIG. 22 is a view of a composite conductor obtained by symmetrically connecting superconductors to a normal conductivity conductor (Ag).

The surfaces of the bar-shaped samples were formed with films of silver of a thickness of 2 μm by sputtering, then, as shown in FIG. 22, the bars were electrically connected using silver paste to two facing surfaces of a 150 mm×7 mm×5 mm silver normal conductivity conductor. This assembly was heated under reduced pressure of $1.3 \times 10^2$ Pa at about 900° C. for about 1 hour to cause sintering of the silver particles of the silver paste, the silver films on the surfaces of the bar-shaped materials, and the silver normal conductivity conductor. Next, the assembly was annealed in a flow of oxygen to prepare a low resistance composite conductor. In detail, the assembly was raised in temperature from room temperature to 600° C. over 6 hours, held there for 1 hour, then lowered in temperature to 450° C. over 2 hours, further lowered in temperature to 380° C. over 60 hours, cooled to room temperature over 12 hours.

The completed low resistance composite conductor was cooled by liquid nitrogen and measured for electrical resistance at 77K. The apparent specific resistance was calculated and found to be $0.6 \times 10^{-9}$ Ωm. The specific resistance in the case of only a silver normal conductivity conductor is $2.6 \times 10^{-9}$ Ωm. Compared with this specific resistance, it was learned that a sufficiently low value was exhibited.

EXAMPLE 14

15 wt % of silver was added and the $Y_2O_3$ changed to $Gd_2O_3$ to prepare a disk-shaped article as prepared in Example 11.

This was raised in temperature in a nitrogen atmosphere containing 0.1 atomic percent of oxygen to 1150° C. over 8 hours and held for 1 hour. Next, an Sm-based crystal was used and the seed crystal arranged so that the normal of the disk surface substantially matched the c-axis at 1040° C. Suitably thereafter, this was lowered in temperature to 1005° C. over 30 minutes, then gradually cooled to 970° C. over 220 hours to grow the crystal. Next, this was cooled to room temperature over 20 hours.

The obtained silver-containing Gd-based bulk material was sliced to a thickness of 1.5 mm, and 30 mm×2.5 mm×1.5 mm bar-shaped samples were prepared.

The thus obtained materials had a structure of a monocrystalline $GdBa_2Cu_3O_{7-x}$ phase in which a 1 μm or so $Gd_2BaCuO_5$ phase was finely dispersed. Further, the c-axis of the $GdBa_2Cu_3O_{7-x}$ phase corresponded to the normal direction of the broadest plane of the bar surface.

The surfaces of the plate-shaped materials were formed with films of silver of a thickness of about 2 μm by sputtering, then the materials were annealed in a flow of oxygen. In detail, the materials were raised in temperature from room temperature to 600° C. over 6 hours and held there for 1 hour, then lowered in temperature to 450° C. over 2 hours, further lowered in temperature to 380° C. over 60 hours, cooled to room temperature over 12 hours.

Figure 23:
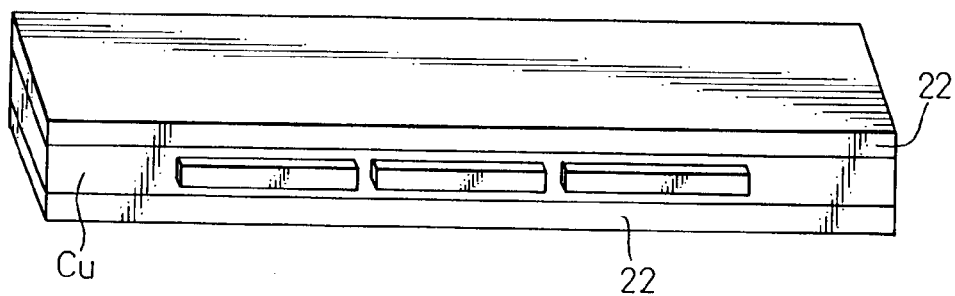
FIG. 23 is a view of a composite conductor obtained by connecting superconductors to a normal conductor (Cu) reinforced by stainless steel.

Next, as shown in FIG. 23, the superconductors were connected by soldering to a copper normal conductivity conductor reinforced by two stainless steel plates 22 of 2 mm thickness to prepare a low resistance composite conductor.

The completed low resistance composite conductor was cooled by liquid nitrogen and measured for electrical resistance at 77K. The apparent specific resistance was calculated and found to be $0.59 \times 10^{-9}$ Ωm. The specific resistance in the case of just a copper normal conductivity conductor is $2.5 \times 10^{-9}$ Ωm. Compared with this specific resistance, it was learned that a sufficient low value is exhibited.

EXAMPLE 15

Low resistance composite conductors prepared at Example 12 were attached as current leads to current leads of an existing direct cooling type superconductor magnet. The locations of attachment were at the low temperature end sides of the existing Bi-based current leads. Parts of the existing copper leads were cut off, then the new leads attached.

70 A was continuously passed through the leads to generate a 10T magnetic field to compare the cooling temperature reached of the superconducting magnet in the state with and without the low resistance conductors. In the state with the low resistance composite conductors not inserted, the temperature reached was 4.5K, while in the case of insertion of the low resistance conductors, it reached 4.1K.

From these results, it was learned that the low resistance composite conductors functioned as current leads and improved the performance of the direct cooling type magnet.

INDUSTRIAL APPLICABILITY

As explained above, the present invention provides a conductor having a low resistance substantially smaller than the specific resistance of copper, a process of production thereof, and various electrical apparatuses using the same. The industrial effects are tremendous.

The invention claimed is:

1. A low resistance conductor using superconductors wherein said low resistance conductor has a longitudinal direction, said low resistance conductor comprised of a plurality of $REBa_2Cu_3O_{7-x}$ based bulk superconductors, in which $RE_2BaCuO_5$ phase is dispersed, where RE is one type or a combination of types of rare earth elements including Y, wherein said plurality of said bulk superconductors have a longitudinal direction parallel to the longitudinal direction of said low resistance conductor and are arranged in two or more layers, said plurality of bulk superconductors electrically connected by normal conductors having a finite electrical resistance, wherein an apparent specific resistance of said low resistance conductor at 77K is lower than a specific resistance of copper at 77K, wherein part or all of the normal conductor electrical connections of said plurality of superconductors are joints between faces substantially parallel to the longitudinal direction of adjoining superconductors, wherein said two or more layers of superconductors are arranged so as to cover normal conductor electrical connections of said superconductors in the longitudinal direction, wherein said two or more layers of superconductors are arranged so as to cover clearances between said superconductors, and wherein electric current flows in the longitudinal direction of said low resistance conductor.

2. A low resistance conductor using superconductors as set forth in claim 1, wherein a clearance distance between superconductors is not more than 10 mm.

3. A low resistance conductor using superconductors wherein said low resistance conductor has a longitudinal direction, said low resistance conductor comprised of a plurality of $REBa_2Cu_3O_{7-x}$ based bulk superconductors, in which $RE_2BaCuO_5$ phase is dispersed, where RE is one type or a combination of types of rare earth elements including Y, wherein said plurality of said bulk superconductors have a longitudinal direction parallel to the longitudinal direction of said low resistance conductor and are arranged in two or more layers, said plurality of bulk superconductors electrically connected by normal conductors having a finite electrical resistance, wherein an apparent specific resistance of said low resistance conductor at 77K is lower than a specific resistance of copper at 77K, wherein part or all of the normal conductor electrical connections of said plurality of superconductors are joints between faces substantially parallel to the longitudinal direction of adjoining superconductors, wherein said two or more layers of superconductors are arranged so as to cover normal conductor electrical connections of said superconductors in the longitudinal direction, and wherein electric current flows in the longitudinal direction of said low resistance conductor.

4. A low resistance conductor using superconductors as set forth in claim 3, wherein said low resistance conductor is a wire-shaped conductor comprised of a plurality of superconductors electrically connected by normal conductors two-dimensionally.

5. A low resistance conductor using superconductors as set forth in claim 3, wherein said low resistance conductor is a plate-shaped conductor comprised of a plurality of superconductors electrically connected by normal conductors three-dimensionally.

6. A low resistance conductor using superconductors as set forth in claim 3, wherein said low resistance conductor is a bar-shaped conductor comprised of a plurality of superconductors electrically connected by normal conductors two-dimensionally.

7. A low resistance conductor using superconductors as set forth in claim 3, wherein said low resistance conductor is a block-shaped conductor comprised of a plurality of superconductors electrically connected by normal conductors three dimensionally.

8. A low resistance conductor using superconductors as set forth in claim 3, wherein part or all of said plurality of bulk superconductors have bar or plate shapes.

9. A low resistance conductor using superconductors as set forth in claim 3, wherein a longitudinal direction of said bulk superconductors is a direction perpendicular to a c-axis in the crystal orientation of said superconductors.

10. A low resistance conductor using superconductors as set forth in claim 3, wherein part of the normal conductor electrical connections of said plurality of superconductors are joints between faces substantially perpendicular to a longitudinal direction of adjoining superconductors.

11. A low resistance conductor using superconductors as set forth in claim 10, wherein a plurality of layers of superconductors are arranged so as to cover normal conductor electrical connections of said superconductors in the longitudinal direction.

12. A low resistance conductor using superconductors as set forth in claim 10, wherein part or all of said normal conductor electrical connections are joints between adjoining superconductors through a metal.

13. A low resistance conductor using superconductors as set forth in claim 12, wherein said metal is one or more of copper, a copper alloy, silver, a silver alloy, gold, a gold alloy, aluminum, and an aluminum alloy.

14. A low resistance conductor using superconductors as set forth in claim 12, wherein a thickness of said metal is not more than 100 μm.

15. A low resistance conductor using superconductors as set forth in claim 3, wherein part or all of said normal conductor electrical connections are joints between adjoining superconductors through a metal.

16. A low resistance conductor using superconductors as set forth in claim 15, wherein said metal is one or more of copper, a copper alloy, silver, a silver alloy, gold, a gold alloy, aluminum, and an aluminum alloy.

17. A low resistance conductor using superconductors as set forth in claim 15, wherein a thickness of said metal is not more than 100 μm.

18. A low resistance conductor using superconductors as set forth in claim 3, wherein part of said plurality of bulk superconductors have curved bar or plate shapes.

19. A low resistance conductor using superconductors as set forth in claim 3, wherein part of said plurality of bulk superconductors have bent bar or plate shapes.

* * * * *